United States Patent
Suh et al.

(10) Patent No.: US 10,435,301 B2
(45) Date of Patent: Oct. 8, 2019

(54) GRAPHENE QUANTUM DOTS WITH DIFFERENT TYPES AND METHOD FOR OBTAINING EACH OF DIFFERENT TYPES OF GRAPHENE QUANTUM DOTS

(71) Applicant: SEOUL NATIONAL UNIVERSITY R&DB FOUNDATION, Seoul (KR)

(72) Inventors: Jung Sang Suh, Seoul (KR); Juhan Kim, Daegu (KR); Myung Woo Lee, Seoul (KR)

(73) Assignee: SEOUL NATIONAL UNIVERSITY R&DB FOUNDATION, Seoul (KR)

(*) Notice: Subject to any disclaimer, the term of this patent is extended or adjusted under 35 U.S.C. 154(b) by 22 days.

(21) Appl. No.: 15/007,918

(22) Filed: Jan. 27, 2016

(65) Prior Publication Data
US 2016/0137508 A1    May 19, 2016

Related U.S. Application Data

(63) Continuation-in-part of application No. 14/557,745, filed on Dec. 2, 2014, now Pat. No. 9,278,863, which
(Continued)

(30) Foreign Application Priority Data

Jun. 11, 2012 (KR) .......................... 10-2012-0062115
Jun. 10, 2013 (KR) .......................... 10-2013-0066141

(51) Int. Cl.
*C01B 32/182* (2017.01)
*C01B 32/194* (2017.01)
(Continued)

(52) U.S. Cl.
CPC ........ *C01B 31/0446* (2013.01); *C01B 32/182* (2017.08); *C01B 32/184* (2017.08);
(Continued)

(58) Field of Classification Search
CPC .................................................. C01B 31/0469
See application file for complete search history.

(56) References Cited

U.S. PATENT DOCUMENTS 6,083,624 A * 7/2000 Hiura ..................... B82Y 15/00
                                                   204/192.15
8,617,669 B1   12/2013 Quick et al.
(Continued)

FOREIGN PATENT DOCUMENTS

KR   1020060100019 A   9/2006
KR   1020100110216 A   10/2010
(Continued)

OTHER PUBLICATIONS

Liu, Yuanyue, "Graphene Edge from Armchari to Zigzag: The Origins of Nanotube Chirality?", Dec. 3, 2010, Physical Review Letters.*
Translation of KR-1020100110216, published Oct. 2010.
International Search Report from International Application No. PCT/KR2013/005109 dated Sep. 6, 2013.
(Continued)

*Primary Examiner* — Allen L Parker
*Assistant Examiner* — Gustavo G Ramallo
(74) *Attorney, Agent, or Firm* — Hamre, Schumann, Mueller & Larson, P.C.

(57) ABSTRACT

The present application provides a method for producing a graphene quantum dot using thermal plasma, comprising injecting a carbon source into a thermal plasma jet to pyrolyze the carbon source so as to form a carbon atomic beam and allowing the carbon atomic beam to flow in a tube connected to an anode to produce a graphene quantum dot. The present application also provides an isolated graphene quantum dot from different types of graphene quantum dots and method for obtaining each of an isolated graphene quantum dot from different types of graphene quantum dots.

2 Claims, 33 Drawing Sheets

Related U.S. Application Data is a continuation of application No. PCT/KR2013/005109, filed on Jun. 11, 2013.

(51) Int. Cl.
*C01B 31/04* (2006.01)
*C01B 32/184* (2017.01)
*B82Y 40/00* (2011.01)
*H01L 21/02* (2006.01)

(52) U.S. Cl.
CPC ............ *C01B 32/194* (2017.08); *B82Y 40/00* (2013.01); *C01B 2204/20* (2013.01); *H01L 21/02527* (2013.01); *H01L 21/02601* (2013.01); *H01L 21/02628* (2013.01); *Y10S 977/774* (2013.01); *Y10S 977/90* (2013.01)

(56) References Cited

U.S. PATENT DOCUMENTS

| | | |
|---|---|---|
| 8,647,436 B2 | 2/2014 | Barker et al. |
| 8,721,843 B2 | 5/2014 | Fullerton et al. |
| 2012/0068154 A1* | 3/2012 | Hwang ................ H01L 51/502 257/13 |

FOREIGN PATENT DOCUMENTS

| | | |
|---|---|---|
| KR | 1020110064164 A | 6/2011 |
| KR | 1020120029332 A | 3/2012 |
| KR | 1020130050167 A | 5/2013 |
| WO | 2011085185 A1 | 7/2011 |

OTHER PUBLICATIONS

Non-final Office Action dated Aug. 13, 2015, in U.S. Appl. No. 14/557,745, Jung Sang Suh, filed Dec. 2, 2014.

\* cited by examiner (a)　　　　　　　　(b)

GRAPHENE QUANTUM DOTS WITH DIFFERENT TYPES AND METHOD FOR OBTAINING EACH OF DIFFERENT TYPES OF GRAPHENE QUANTUM DOTS

CROSS-REFERENCE TO RELATED APPLICATION

This application is a continuation-in-part of U.S. application Ser. No. 14/557,745 filed on Dec. 2, 2014, which is the continuation of application No. PCT/KR2013/005109 filed on Jun. 11, 2013 which claims priorities to Korean Patent Application No. 10-2012-62115 filed on Jun. 11, 2012 and Korean Patent Application No. 10-2013-66141 filed on Jun. 10, 2013 before the Korean Intellectual Property Office, the entire contents of which are hereby incorporated by reference.

TECHNICAL FIELD

The embodiments described herein pertain generally to a method for producing a graphene quantum dot using thermal plasma. Further, the embodiments described herein pertain generally to an isolated graphene quantum dot from different types of graphene quantum dots and a method for obtaining each of an isolated graphene quantum dot from different types of graphene quantum dots.

BACKGROUND ART

Graphene is a material having a two-dimensional planar structure in a honeycomb shape, in which carbon atoms are connected to one another to form a hexagonal structure, and exhibits chemically high stability. In addition, since graphene has at least one hundred (100) times greater electrical conductivity than silicon and is flexible and transparent, it is drawing much attention as a next-generation semiconductor material.

With respect to a method for producing a quantum dot of graphene, there are known a top down method that sizes down large-size graphene, a bottom up method that self-assembles and then pyrolyzes a small carbon ring material like hexa-peri-hexabenzocoronene (HBC), and others. In addition, Korean Patent Application Publication No. 2013-0050167 discloses a method for producing a graphene quantum dot and a graphene quantum dot produced by the method. However, these methods have a limit in large-scale production of graphene quantum dots. Further, since a graphene quantum dot is known to have applicability in various fields, it is necessary to develop a technology capable of producing high crystalline graphene quantum dots in a large scale for research of physical properties and application of the graphene quantum dots.

Graphene quantum dots (GQDs), which are graphene sheets that are smaller than 100 nm, possess strong edge effects and quantum confinement. The edge effects allow dispersion in solvents such as ethanol, while graphene, which is a pure carbon material, is not dispersible in common solvents. Graphene is a zero band gap semiconductor, which means its electronic and optoelectronic properties are reduced and it is almost impossible to use it for device applications. However, quantum confinement allows the band gap of GQDs to be controlled by modulating their size. GQDs can exhibit photoluminescence due to their band gap. Their dispersible property, nonzero band gap, chemical inertness, biocompatibility, low toxicity and strong photoluminescence make them excellent materials for applications such as nanoscale optics, electronic devices, bioimaging, OLEDs, fuel cells, photovoltaic devices, composites and biosensors.

Controlled fabrication methods for stable graphene nanostructures provide a chance to investigate outstanding optical and transport properties of these structures. Both top-down and bottom-up methods have been used to prepare GQDs. Cutting of graphene sheets or graphene oxide sheets or carbon fibers or self-assembled block copolymer or tattered graphite or carbon black or coal corresponds to a top-down method, while self-assembling of aromatic carbons followed by pyrolysis, cyclodehydrogenation of polyphenylene precursors, microwave-assisted hydrothermal method, tuning the carbonization degree of citric acid, and pulsed laser synthesis method from benzene correspond to a bottom-up method. Cage-opening of fullerenes may be categorized as a third method. However, these methods have some drawbacks in the aspects of low-cost production, size-controllable fabrication, and mass production.

DISCLOSURE OF THE INVENTION

Problems to be Solved by the Invention

Example embodiments relate to a method for producing a graphene quantum dot using thermal plasma, which produces the graphene quantum dot by injecting a carbon source into a thermal plasma jet to pyrolyze the carbon source so as to form a carbon atomic beam to flow at a rapid velocity, and allowing the carbon atomic beam to flow in a tube connected to an anode such that carbon atoms collide with one another while flowing in the tube.

Further, the embodiments described herein pertain generally to graphene quantum dots with different types of and method for preparing graphene quantum dot by separating and obtaining each of the different types of graphene quantum dots.

However, the problems sought to be solved by the present disclosure are not limited to the above description and other problems can be clearly understood by those skilled in the art from the following description.

Means for Solving the Problems

In accordance with one aspect of an example embodiment, a method for producing a graphene quantum dot using thermal plasma, comprising injecting a carbon source into a thermal plasma jet to pyrolyze the carbon source so as to form a carbon atomic beam; and allowing the carbon atomic beam to flow in a tube connected to an anode to produce the graphene quantum dot.

In accordance with another aspect of an example embodiment, the embodiments described herein pertain generally to an isolated graphene quantum dot from different types of graphene quantum dots and method for obtaining each of an isolated graphene quantum dot from different types of graphene quantum dots.

Effect of the Invention

In accordance with example embodiments, since a degree of the collision of the carbon atoms occurring within the tube can be controlled by controlling a length of the tube, through which the carbon atomic beam flows, or by controlling an amount of the carbon source, it is possible to control an average size of a quantum dot to be produced, and it is possible to produce a graphene quantum dot in a size of from a few nanometers to hundreds of nanometers. Furthermore, since the carbon source material can be continuously supplied, it is possible to continuously produce a graphene quantum dot in a large scale. In addition, since the thermal plasma jet may have a high temperature ranging from thousands of degrees (° C.) to tens of thousands of degrees (° C.), it is possible to produce a high quality graphene quantum dot having high crystallinity by using the thermal plasma jet.

In accordance with another exemplary embodiment, it is possible to produce carbon soot including different types of graphene quantum dots which do not contain oxygen by using a thermal plasma method, and it is possible to obtain isolated graphene quantum dots by separating and extracting the different types of graphene quantum dots with a mixture of polar and nonpolar solutions and then readily separating a polar graphene quantum dot having a polar characteristic, a nonpolar hexagonal graphene quantum dot having a nonpolar characteristic, an amphoteric rectangular graphene quantum dot having both of polar and nonpolar characteristics, and a nanoscale onion-type carbon material. Each of the isolated graphene quantum dots having different shapes and different characteristics does not contain oxygen and has improved crystallinity and photoluminescence (PL). Therefore, the graphene quantum dots can be applied for various uses.

DETAILED DESCRIPTION

Figure 1:
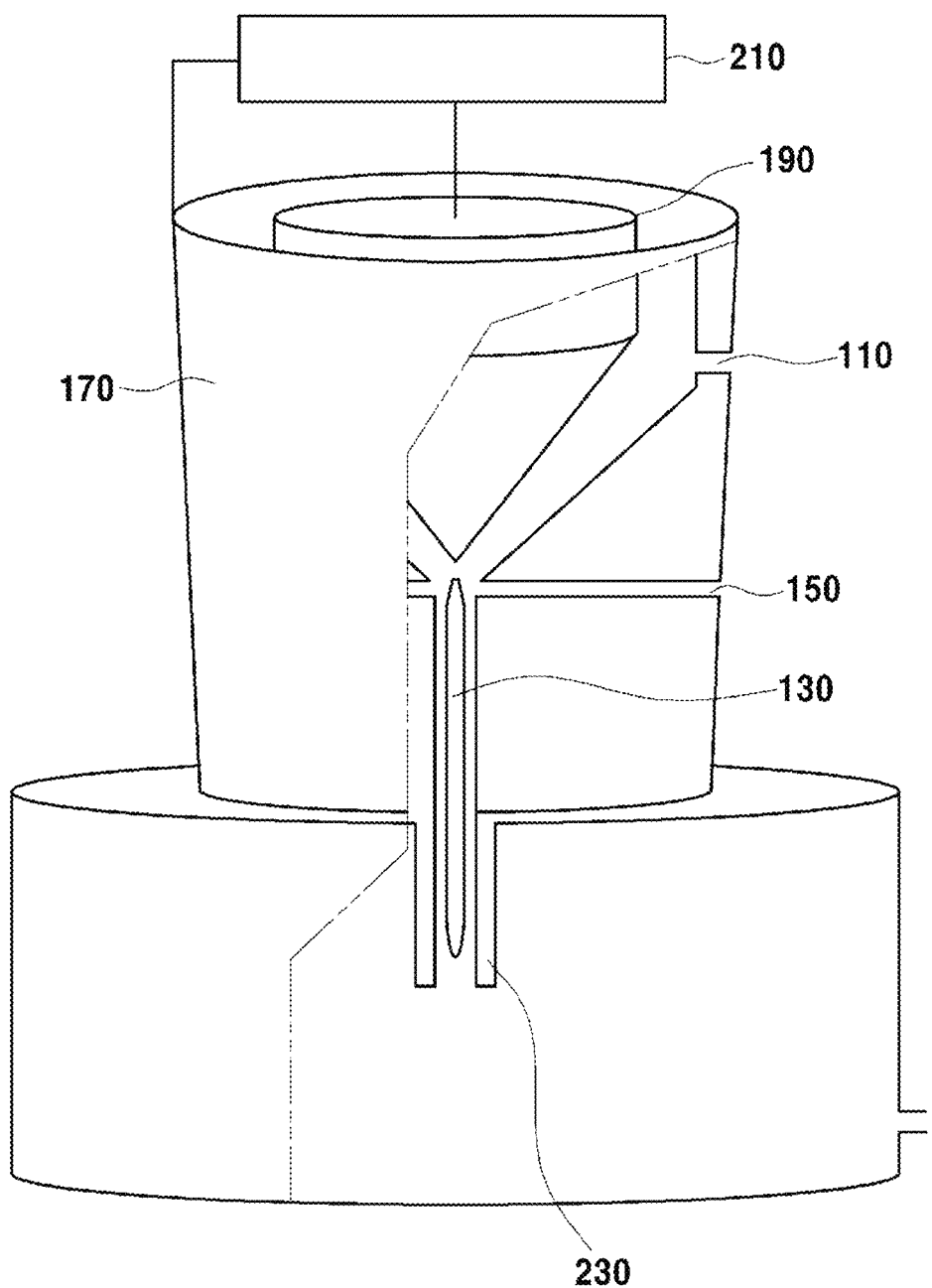
FIG. 1 is a schematic diagram of an apparatus used in a method for producing a graphene quantum dot using thermal plasma in accordance with an example of the present application disclosure.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

In this document, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Throughout the whole document, the term "step of" does not mean "step for."

Throughout the whole document, the term "on" that is used to designate a position of one element with respect to another element includes both a case that the one element is adjacent to the another element and a case that any other element exists between these two elements.

Throughout the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Throughout the whole document, the description "A and/or B" means "A or B, or A and B.

Hereinafter, example embodiments and Examples of the present disclosure are described in detail with reference to the accompanying drawings, but the present disclosure is not limited to the example embodiments and the Examples.

In accordance with a first aspect of example embodiments, there are provided a method for producing a graphene quantum dot using thermal plasma, which includes injecting a carbon source into a thermal plasma jet to pyrolyze the carbon source so as to form a carbon atomic beam, and allowing the carbon atomic beam to flow in a tube connected to an anode to produce the graphene quantum dot.

FIG. 1 is a schematic diagram of an apparatus used in a method for producing a graphene quantum dot using thermal plasma in accordance with an example embodiment.

According to FIG. 1, in the apparatus used in the method for producing a graphene quantum dot using thermal plasma, plasma gas is injected through a plasma gas inlet 110 so as to form a high temperature plasma jet 130, and a carbon source inlet 150 may be formed near the plasma jet. In addition, the apparatus may include an anode 170, a cathode 190, and a power supply 210 connected to the anode and the cathode, and a tube 230 may be connected to the anode.

For example, the method for producing a graphene quantum dot using thermal plasma may include pyrolyzing and atomizing a relatively excess amount of a hydrocarbon-based material such as ethylene under a high temperature provided by a thermal plasma jet, and then, introducing the carbon atoms into the thermal plasma jet to generate a carbon atomic beam, and allowing the carbon atomic beam to flow in the tube which is attached to an anode and to allow the carbon atoms to collide with one another while flowing in the tube so as to produce a graphene quantum dot of a small size in a large scale, but may not be limited thereto.

For example, forming the carbon atomic beam may include introducing the carbon atoms pyrolyzed and atomized by the high temperature thermal plasma jet into the thermal plasma jet so as to form the rapidly flowing carbon atomic beam, but may not be limited thereto.

The "method for producing graphene by using thermal plasma" (Korean Patent Application Publication No. 10-2009-0028681), which was previously developed by the inventors of the present application, relates to continuously injecting a small amount of a carbon source into thermal plasma to allow a carbon atomic beam having relatively low carbon atom density to flow in the carbon tube, and then, allowing the carbon atomic beam to collide with a graphite plate, wherein graphene is produced on the graphite surface by epitaxial growth, and whereby the graphene in a size of from tens of nanometers to a few micrometers was produced.

On the other hand, the method for producing a graphene quantum dot using thermal plasma in accordance with an example embodiment may include continuously injecting a relatively excess amount of a carbon source into a thermal plasma jet such that collision of carbon atoms occurs within the tube while the carbon atomic beam having high density flows in the tube, so as to produce a graphene quantum dot of a small size. That is, since the previous method for producing graphene produces graphene on a surface of graphite, it is substantially different from the method for producing a graphene quantum dot in accordance with an example embodiment.

In accordance with an example embodiment, the method may include allowing carbon atoms to collide to another in the tube to produce the graphene quantum dot while the carbon atomic beam flows in the tube, but may not be limited thereto.

For example, an internal diameter of the tube may be from about 1 mm to about 50 mm, but not be limited thereto. For example, the diameter of the tube may be from about 1 mm to about 50 mm, from about 5 mm to about 50 mm, from about 10 mm to about 50 mm, from about 20 mm to about 50 mm, from about 30 mm to about 50 mm, from about 40 mm to about 50 mm, from about 1 mm to about 40 mm, from about 1 mm to about 30 mm, from about 1 mm to about 20 mm, from about 1 mm to about 10 mm, from about 1 mm to about 5 mm, or from about 4 mm to about 6 mm, but not be limited thereto.

For example, a length of the tube may be from about 5 cm to about 100 cm, and may be, for example, from about 5 an to about 100 cm, from about 10 cm to about 100 cm, from about 30 cm to about 100 cm, from about 50 cm to about 100 cm, from about 70 cm to about 100 cm, from about 5 cm to about 70 cm, from about 5 cm to about 50 cm, from about 5 cm to about 20 cm, or from about 5 cm to about 10 cm, but not be limited thereto.

For example, the time during which the collision of the carbon atoms occurs may be controlled by controlling the length of the tube, so that an average size of the graphene quantum dot to be produced may be controlled, but the present disclosure may not be limited thereto.

For example, an injection rate of the carbon source may be from about 500 mL/min to about 10,000 mL/min, and for example, from about 500 mL/min to about 10,000 mL/min, from about 1,000 mL/min to about 10,000 mL/min, from about 3,000 mL/min to about 10,000 mL/min, about 5,000 mL/min to about 10,000 mL/min, from about 7,000 mL/min to about 10,000 mL/min, from about 500 mL/min to about 7,000 mL/min, from about 500 mL/min to about 5,000 ml/min, from about 500 mL/min to about 3,000 mL/min, or from about 500 mL/mint to about 1,000 mL/min, but not be limited thereto.

For example, a size of the graphene quantum dot produced by the method for producing a graphene quantum dot using thermal plasma in accordance with an example embodiment may be from about 1 nm to about 100 nm, and for example, from 1 nm to about 100 nm, from about 5 nm to about 100 nm, from about 10 nm to about 100 nm, from about 30 nm to about 100 nm, from about 50 nm to about 100 nm, from about 70 nm to about 100 nm, from about 1 nm to about 70 nm, from about 1 nm to about 50 nm, from about 1 nm to about 30 nm, from about 1 nm to about 10 nm, or from about 1 nm to about 5 nm, but not be limited thereto.

For example, the carbon atomic beam may have a relatively high carbon atom density, but not be limited thereto.

For example, the carbon source is pyrolyzed and completely atomized at a high temperature, and the carbon atomic beam including the carbon atoms flow in the tube such that the carbon atoms collide with one another to produce a graphene quantum dot having high crystallinity, but the present disclosure may not be limited thereto.

For example, probability of the collision of the carbon atoms may be controlled by controlling an amount of the carbon source to be injected per unit time, by which the average size of the graphene quantum dot to be produced may be controlled, but the present disclosure may not be limited thereto.

In accordance with example embodiments, since a relatively large amount of a carbon source can be continuously supplied, it is possible to continuously produce the graphene quantum dot in a large scale.

In accordance with an example embodiment, example embodiments may further include dispersing the pyrolyzed carbon source and the produced graphene quantum dot in a solvent, and separating and obtaining the graphene quantum dot, but the present disclosure may not be limited thereto.

For example, the carbons pyrolyzed by the thermal plasma jet may include carbon soots, and the carbon soots may include graphene, carbon materials having different sizes, onion-shaped carbon materials and others, but not be limited thereto. Accordingly, it is possible to disperse the carbon soots in the solvent, and then, separate and obtain the graphene quantum dot dispersed in the solvent from materials other than the graphene, which have not been easily dispersed in the solvent, but the present disclosure may not be limited thereto.

For example, in order to obtain the graphene quantum dot from the carbon soots dispersed in the solvent, a method that disperses the carbon soots in a solvent like ethanol, followed by natural precipitation, promotes the precipitation by using a centrifuge, and/or removes precipitates by using a filter may be used, but the present disclosure may not be limited thereto.

For example, the solvent may include water and/or an organic solvent, but not be limited thereto.

In accordance with an example embodiment, the solvent may include an organic solvent, but not be limited thereto. For example, the organic solvent may include a member selected from the group consisting of ethanol, benzene, an ether, acetone, toluene, dimethyl sulfoxide (DMSO), pyridine, and combinations thereof, but not be limited thereto.

In accordance with an example embodiment, the thermal plasma jet may be generated by supplying plasma gas to a plasma torch, but not be limited thereto. For example, the plasma torch may include a transferred or non-transferred type of a plasma torch, but not be limited thereto. For example, the plasma torch may include an anode and a cathode, but not be limited thereto. For example, a diameter of the anode may be from about 1 mm to about 50 mm, but not be limited thereto. For example, the diameter of the anode may be from about 1 mm to about 50 mm, from about 5 mm to about 50 mm, from about 10 mm to about 50 mm, from about 20 mm to about 50 mm, from about 30 mm to about 50 mm, from about 40 mm to about 50 mm, from about 1 mm to about 40 mm, from about 1 mm to about 30 mm, from about 1 mm to about 20 mm, from about 1 mm to about 10 mm, from about 1 mm to about 5 mm, or from about 4 mm to about 6 mm, but not be limited thereto.

In accordance with an example embodiment, the plasma torch may include a non-transferred type of a plasma torch, but not be limited thereto.

For example, in order to inject the carbon source into the thermal plasma jet, a carbon source inlet may be formed in the vicinity of the plasma jet, but the present disclosure may not be limited thereto. For example, the carbon source inlet may be located that is from about 0 mm to about 20 mm away from the cathode, and for example, from about 0 mm to about 20 mm, from about 5 mm to about 20 mm, from about 10 mm to about 20 mm, from about 15 mm to about 20 mm, from about 0 mm to about 15 mm, from about 0 mm to about 10 mm, or from about 0 mm to about 5 mm away from the cathode, but the present disclosure may not be limited thereto.

In accordance with an example embodiment, the plasma gas may include inert gas, and for example, a member selected from the group consisting of argon (Ar), nitrogen ($N_2$), hydrogen ($H_2$), helium (He), neon (Ne), xenon (Xe), radon (Rn), krypton (Kr) and combinations thereof, but may not be limited thereto.

In accordance with an example embodiment, a temperature of the thermal plasma jet may include a temperature of from about 1,000° C. to 20,000° C., but not be limited thereto. For example, the temperature of the thermal plasma jet may include a temperature of from about 1,000° C. to about 20,000° C., about 1,000° C. to about 15,000° C., about 1,000° C. to about 10,000° C., about 1,000° C. to about 5,000° C., about 1,000° C. to about 3,000° C., about 3,000° C. to about 20,000° C., about 5,000° C. to about 20,000° C., about 7,000° C. to about 20,000° C., about 10,000° C. to about 20,000° C., about 15,000° C. to about 20,000° C., or about 5,000° C. to about 10,000° C., but not be limited thereto. In accordance with an example embodiment, the carbon source may include a gaseous or liquid phase carbon source, but not be limited thereto.

In accordance with an example embodiment, hydrocarbons having a relatively small molecular weight may be used as the carbon source without limitation, and include, for example, a member selected from the group consisting of carbon monoxide, carbon dioxide, methane, ethane, ethylene, ethanol, methanol, propanol, butanol, pentanol, acetylene, propane, butane, butadiene, pentane, pentene, cyclopentadiene, hexane, cyclohexane, benzene, toluene, and combinations thereof, but not be limited thereto. For example, alcohols may be used as the carbon source without limitation, but not be limited thereto.

For example, any materials that can bear the high temperature of the plasma jet may be used as a material for the tube without limitation.

In accordance with an example embodiment, the tube may include a ceramic, a metal, or a carbon, but not be limited thereto.

In accordance with an example embodiment, a size of the graphene quantum dot to be produced may be controlled by controlling the length of the tube, but the present disclosure may not be limited thereto.

In accordance with an example embodiment, a size of the graphene quantum dot to be produced may be controlled by controlling an amount of the carbon source to be injected, but the present disclosure may not be limited thereto.

In accordance with a second aspect of example embodiments, there is provided an isolated graphene quantum dot including one of the following graphene quantum dots: a poplar graphene quantum dot including a polar surface and/or a polar edge and having a hexagonal shape; a nonpolar graphene quantum dot including a nonpolar surface and/or a nonpolar edge and having a hexagonal shape; and an amphoteric graphene quantum dot including an amphoteric surface and/or an amphoteric edge and having a rectangular shape.

According to the conventional technology, it was impossible to actually obtain each isolated graphene quantum dot from the above-described three types of graphene quantum dots having different shapes and different characteristics by separation, and, thus, it was impossible to actually measure and analyze the characteristics of each of the respective graphene quantum dots. On the other hand, according to the present disclosure, it was possible to actually find graphene quantum dots isolated from each other.

In accordance with a third aspect of example embodiments, there is provided an onion-type carbon nanoparticle which is not dissolved in a polar solvent and a nonpolar solvent.

In an embodiment of the present disclosure, the edge of the polar graphene quantum dot may include a lone pair of electrons of electrons. The polar graphene quantum dot may be dispersed or dissolved well in a polar solvent. In an embodiment of the present disclosure, the edge of the nonpolar graphene quantum dot may include a carbon-carbon triple bond. The nonpolar graphene quantum dot may be dispersed or dissolved well in a nonpolar solvent. In an embodiment of the present disclosure, two facing edges of the rectangular amphoteric graphene quantum dot may include a carbon-carbon triple bond, and the other two facing edges may include a lone pair of electrons of electrons. The amphoteric graphene quantum dot may be dispersed or dissolved well in both of a polar solvent and a nonpolar solvent. The polar solvent may include water or an aqueous solution, and the nonpolar solvent may include an alcohol, an ester, an ether, an aliphatic hydrocarbon or its derivative, or an aromatic hydrocarbon or its derivative, but may not be limited thereto. For example, the polar solvent may include water or an aqueous solution of acetic acid, but may not be limited thereto. For example, the nonpolar solvent may include a C1-C6 alcohol, a C1-C6 alkyl ester, a di-C1-C6 alkyl ether, a C1-C6, C1-C8 or C1-C10 aliphatic cyclic or noncyclic hydrocarbon or its derivative, or a C6-C12, C6-C10 or C6-C8 aromatic hydrocarbon or its derivative. Specifically, the nonpolar solvent may include benzene, cyclohexane, n-butanol, butyl acetate, ethyl acetate, pentane, toluene, hexane, chlorobenzene, diethyl ether, chloroform, dichloromethane, diethyl ether, but may not be limited thereto.

In an embodiment of the present disclosure, the surfaces or edges of the graphene quantum dots do not contain oxygen.

Figure 13:
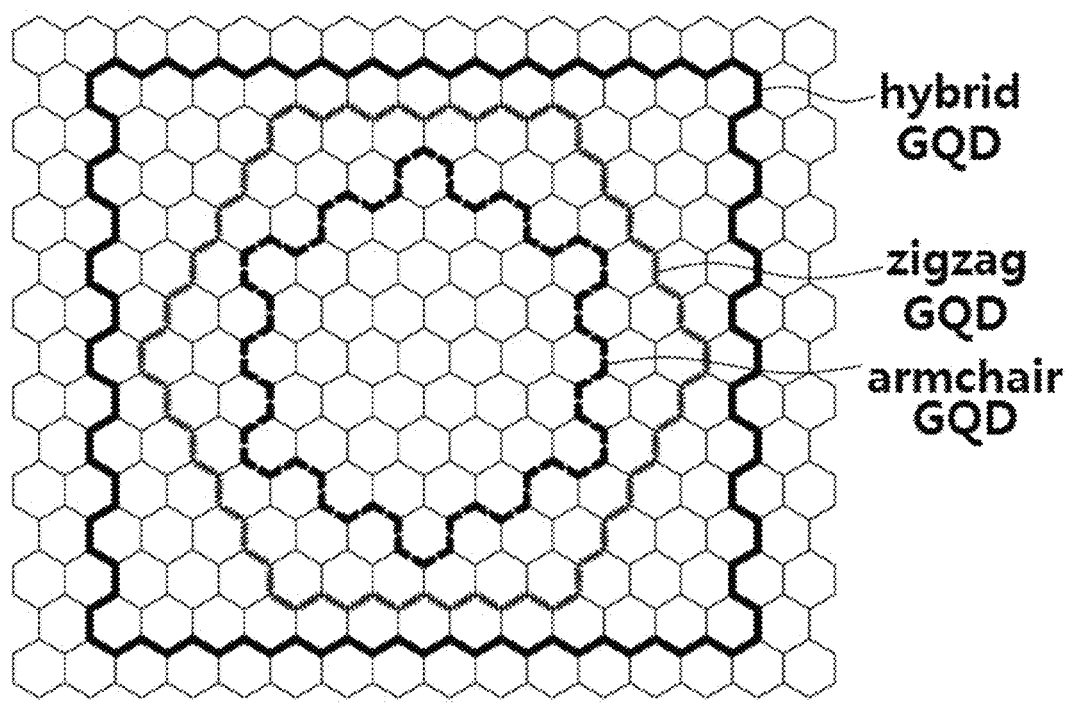
FIG. 13 is a schematic diagram of a model of three types of graphene quantum dots: armchair, zigzag, and hybrid GQDs respectively.
Figure 14:
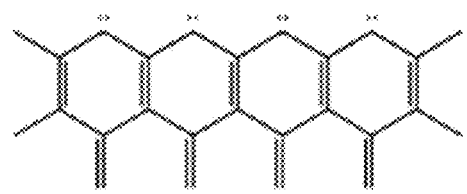
FIG. 14 is the edge structures of (a) carbene and (b) carbyne in the graphene quantum dots in accordance with an embodiment of the present application disclosure.
Figure 14:
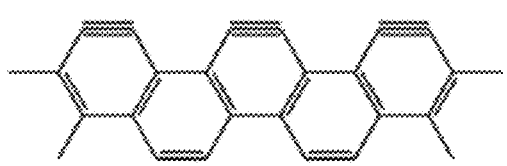

On a graphene sheet, a 120 degree corner is obtained when two armchair lines or two zigzag lines are encountered, while a 90 degree corner is obtained when an armchair and a zigzag lines are encountered (FIG. 13). Therefore, while tailoring a graphene sheet, hexagonal GQDs are obtained when the same type of lines are encountered at all corners, while rectangular GQDs are obtained when different types of lines are encountered at all the corners. When a graphene sheet is cut along an armchair line, carbon triple bonds are made at edges (FIG. 14). It is called carbyne, which may have a nonpolar characteristic due to carbon triple bonds at edges. When a graphene sheet is cut along a zigzag line, two unshared valence electrons are obtained on each carbon atom at the edge. It is called carbene, which may have a polar characteristic due to the lone pair of electrons of electrons. Therefore, three types of GQDs could be distinguished by their shape and edge structure or dissolving property: two types of hexagonal GQDs dissolve in either polar or nonpolar solvent and rectangular GQDs dissolve in both polar and nonpolar solvents. GQDs that can be dissolved in a nonpolar solvent such as cyclohexane and have hexagonal shapes are named as armchair or nonpolar hexagonal (or simply nonpolar) GQDs. GQDs that can be dissolved in a polar solvent such as water and have hexagonal shapes are named as zigzag or polar hexagonal (or simply polar) GQDs. The GQDs that can be dissolved in both polar and nonpolar solvents and have rectangular shapes could be named as hybrid or amphoteric rectangular (or simply amphoteric) GQDs.

In accordance with a fourth aspect of example embodiments, there is provided a method for producing an isolated graphene quantum dot, including the followings: obtaining carbon soot including one or more kinds of graphene quantum dots; adding the carbon soot onto a polar solvent, followed by adding a nonpolar solvent onto the polar solvent, and then leaving the mixture to stand; and separating a layer of the polar solvent and a layer of the nonpolar solvent and then isolating each of graphene quantum dots by removing the solvents from the respective layers.

According to the conventional technology, it was impossible to actually obtain the above-described three types of isolated graphene quantum dots having different shapes and different characteristics by separation, and, thus, it was impossible to actually measure and analyze the characteristics of the respective graphene quantum dots. On the other hand, according to the present disclosure, it was possible to actually find graphene quantum dots isolated from each other.

In an embodiment of the present disclosure, the carbon soot may be formed by gas phase collision reaction of carbon atoms using a thermal plasma jet, but may not be limited thereto.

In an embodiment of the present disclosure, the carbon soot may include one or more of the following graphene quantum dots, but may not be limited thereto: a poplar graphene quantum dot including a polar surface and/or a polar edge and has a hexagonal shape; a nonpolar graphene quantum dot including a nonpolar surface and/or a nonpolar edge and having a hexagonal shape; and an amphoteric graphene quantum dot including an amphoteric surface and/or an amphoteric edge and having a rectangular shape.

In an embodiment of the present disclosure, the carbon soot may further include an onion-type carbon material, but may not be limited thereto. In an embodiment of the present disclosure, the polar solvent may include water or an aqueous solution, and the nonpolar solvent may include an alcohol, an ester, an ether, an aliphatic hydrocarbon or its derivative, or an aromatic hydrocarbon or its derivative, but may not be limited thereto. For example, the polar solvent may include water or an aqueous solution of acetic acid, but may not be limited thereto. For example, the nonpolar solvent may include a C1-C6 alcohol, a C1-C6 alkyl ester, a di-C1-C6 alkyl ether, a C1-C6, C1-C8 or C1-C10 aliphatic cyclic or noncyclic hydrocarbon or its derivative, or a C6-C12, C6-C10 or C6-C8 aromatic hydrocarbon or its derivative. Specifically, the nonpolar solvent may include benzene, cyclohexane, n-butanol, butyl acetate, ethyl acetate, pentane, toluene, hexane, chlorobenzene, diethyl ether, chloroform, dichloromethane, diethyl ether, but may not be limited thereto.

In an embodiment of the present disclosure, the adding the carbon soot onto the polar solvent may include dispersing the carbon soot on a surface of the polar solvent, but may not be limited thereto. In this case, it is desirable to carefully disperse the carbon soot on the surface of the polar solvent in a manner not to cause turbulence on the surface of the polar solvent.

In an embodiment of the present disclosure, the graphene quantum dot obtained from the separated polar solvent layer may include a polar graphene quantum dot including a polar surface and/or a polar edge, and the graphene quantum dot obtained from the separated nonpolar solvent layer may include a nonpolar graphene quantum dot including a nonpolar surface and/or a nonpolar edge, but may not be limited thereto.

In an embodiment of the present disclosure, the method for producing an isolated graphene quantum dot may further include separating a graphene quantum dot or material present between the polar solvent layer and the nonpolar solvent layer, but may not be limited thereto. In this case, the separated material may include an onion-type carbon nanoparticle which is not dissolved in the polar solvent and the nonpolar solvent, but may not be limited thereto.

In an embodiment of the present disclosure, the method for producing an isolated graphene quantum dot may further include repeating one or more times a procedure including: adding a nonpolar solvent onto the separated polar solvent layer and leaving the mixture to stand; separating the polar solvent layer; and obtaining a graphene quantum dot by removing the polar solvent, but may not be limited thereto. In an embodiment of the present disclosure, the method for producing an isolated graphene quantum dot may further include repeating one or more times a procedure including: adding a polar solvent onto the separated nonpolar solvent layer and leaving the mixture to stand; separating the polar solvent layer; and obtaining the amphoteric graphene quantum dot by removing the polar solvent, but may not be limited thereto. In this case, the graphene quantum dot obtained from the polar solvent layer includes an amphoteric surface and/or an amphoteric edge.

In the present disclosure, a sequence of the polar solvent and the nonpolar solvent may be changed. Accordingly, in another embodiment of the present disclosure, there is provided a method for producing an isolated graphene quantum dot, including the followings: obtaining carbon soot including different kinds of graphene quantum dots; adding the carbon soot into a nonpolar solvent, followed by adding a polar solvent onto the nonpolar solvent, and then leaving the mixture to stand; and separating a layer of the nonpolar solvent and a layer of the polar solvent and then isolating each of graphene quantum dots from the different kinds of graphene quantum dots by removing the solvents from the respective layers.

In the present disclosure, the carbon soot is formed by gas phase collision reaction of carbon atoms using a thermal plasma jet.

Hereinafter, example embodiments are described in more detail by using Examples, but the present disclosure may not be limited to the Examples.

EXAMPLES

Example 1

Production of a Graphene Quantum Dot Using Thermal Plasma

A plasma jet having a temperature of about 10,000° C. was formed by using a non-transferred type of a thermal plasma torch, and argon (99.999%, an injection rate of 16,000 mL/min) as a plasma gas, and applying voltage of maximum about 3 kV. The temperature of the plasma jet was indirectly measured through flame color. Accordingly, a plasma jet with a rate close to the sound velocity was formed and flowed in a copper nozzle having an internal diameter of about 6 mm. Thereafter, $C_2H_4$ gas was injected into the plasma jet at a rate of from 1,000 mL/min to 2,500 mL/min, and a produced carbon atomic beam was allowed to flow in a carbon tube attached to an anode. After the produced carbon soots were stirred and dispersed in an ethanol solvent by using a stirring rod, a precipitated material was removed, and thereafter, the ethanol solvent was vaporized, so that a graphene quantum dot was obtained. By this process, a graphene quantum dot corresponding to about 10% of the mass of the carbon soots, i.e., about 10 wt % was obtained.

Figure 2A:
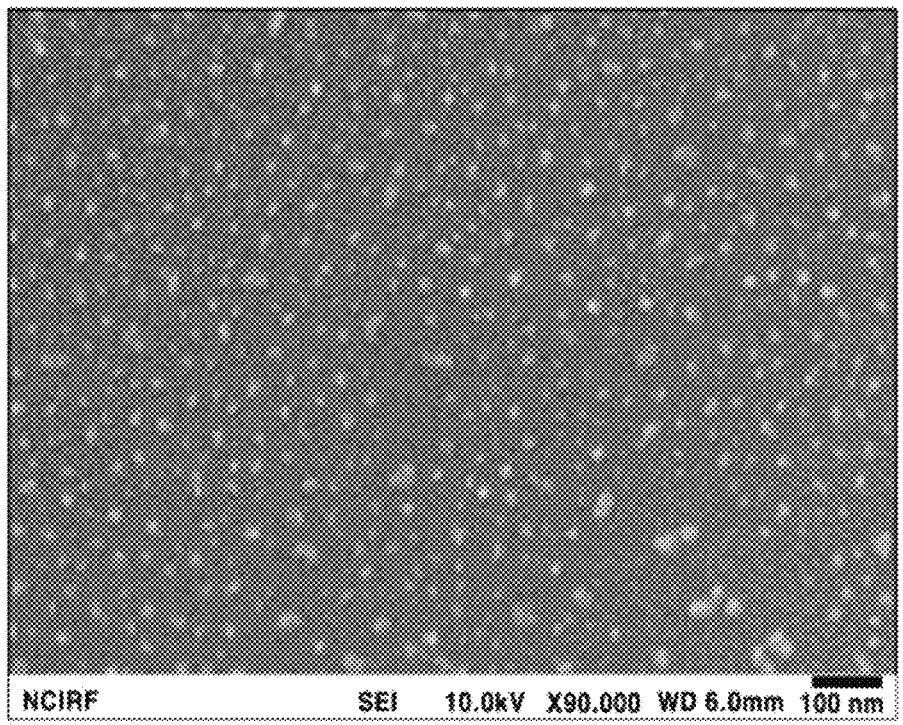
FIG. 2A and FIG. 2B are scanning electron microscope (SEM) images of a graphene quantum dot produced in accordance with an example of the present application disclosure.
Figure 2B:
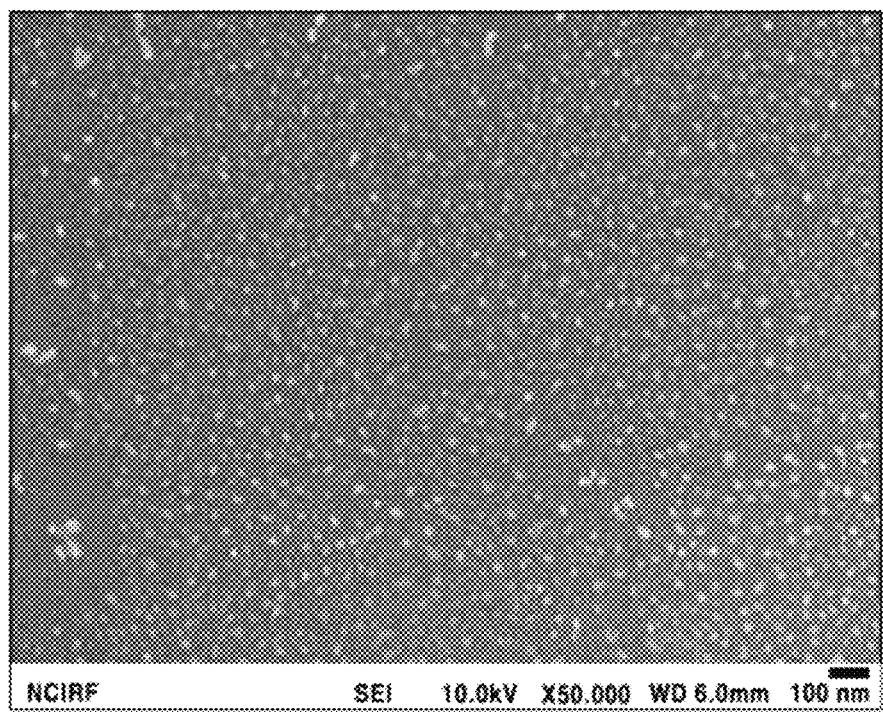

FIG. 2A and FIG. 2B show results of observation of the produced graphene quantum dot using a scanning electron microscope (SEM). FIG. 2A is a 90,000 times enlarged image of graphene quantum dot, and FIG. 2B is a 50,000 times enlarged image of graphene quantum dot. According to FIG. 2A and FIG. 2B, it was confirmed that most of the graphene quantum dots obtained by the present Example are not aggregated together and preferably exist in the independent state. It was presumed that the aggregation of several graphene quantum dots on the image occurred during the sampling process.

Control of a size of the graphene quantum dot according to control of an injection rate of the carbon source.

Figure 3A:
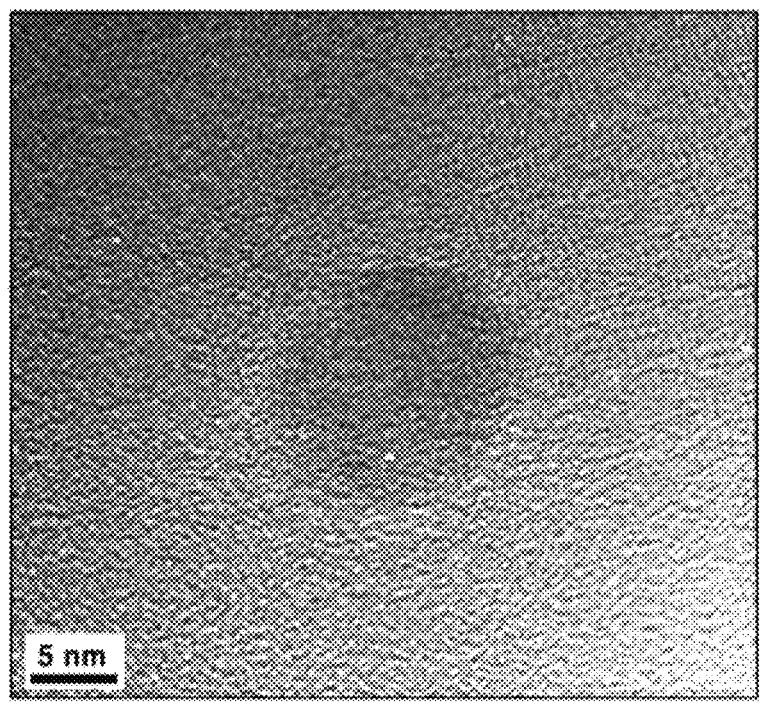
FIG. 3A and FIG. 3B are transmission electron microscope images of a graphene quantum dot produced by controlling an injection rate of a carbon source in accordance with an example of the present application disclosure.

In the present Example, after the graphene quantum dot was produced by varying an injection rate of ethylene used as the carbon source in a range of from 1,000 mL/min to 2,500 mL/min, a size of the produced graphene quantum dot was measured. FIG. 3A shows results of observation of graphene obtained when an injection rate of ethylene is 1,000 mL/min and FIG. 3B shows results of observation of graphene obtained when the injection rate of ethylene is 2,500 mL/min, using a transmission electron microscope (TEM).

Figure 3B:
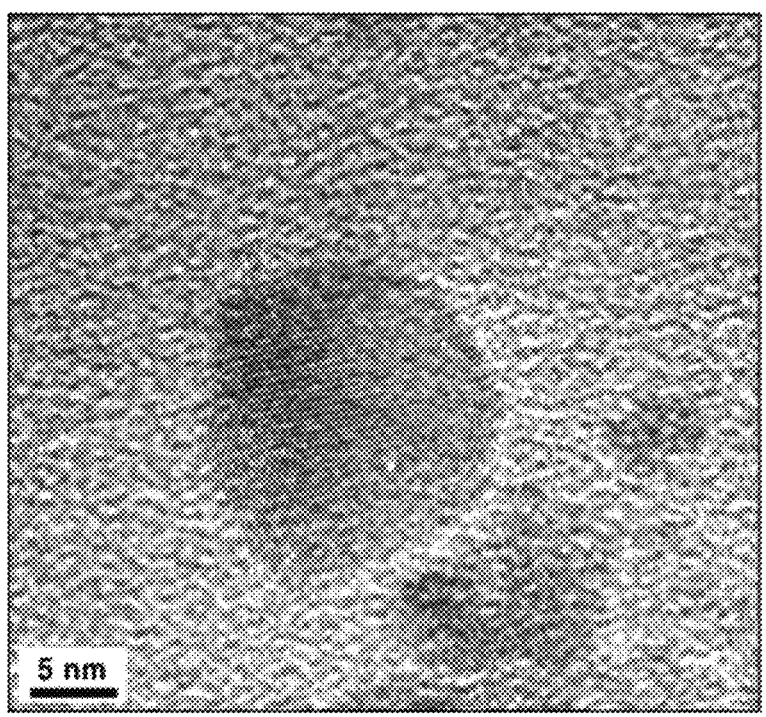

According to FIG. 3A and FIG. 3B, when the injection rate of ethylene was 1,000 mL/min, a graphene quantum dot in a size of about 10 nm was produced, and when the injection rate of ethylene was 2,500 mL/min, a graphene quantum dot in a size of about 19 nm was produced. Thus, it was confirmed that the size of the graphene quantum dot to be produced can be controlled by controlling the injection rate of the carbon source.

Control of a size of the graphene quantum dot according to control of a length of the tube (1)

Figure 4A:
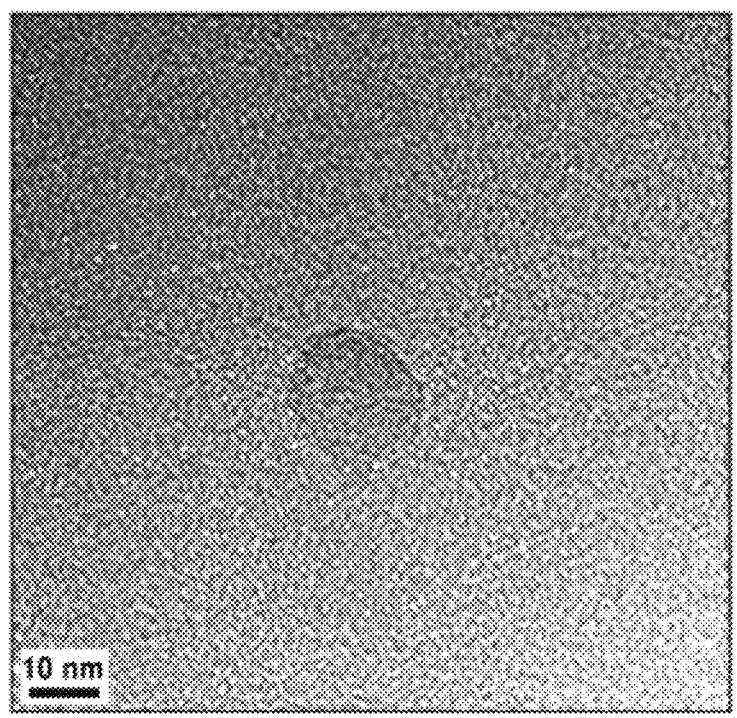
FIG. 4A and FIG. 4B are transmission electron microscope images of a graphene quantum dot produced by controlling a length of a tube in accordance with an example of the present application disclosure.

In the present Example, the graphene quantum dot was produced by using carbon tubes having length of 20 cm and 5 cm (internal diameter of 2.0 cm), respectively, and injecting ethylene at a rate of 2,500 mL/min. FIG. 4A is a transmission electron microscope image of the graphene quantum dot obtained when the carbon tube having 20 cm length was used, and FIG. 4b is a transmission electron microscope image of the graphene quantum dot obtained when the carbon tube having 5 cm length was used.

Figure 4B:
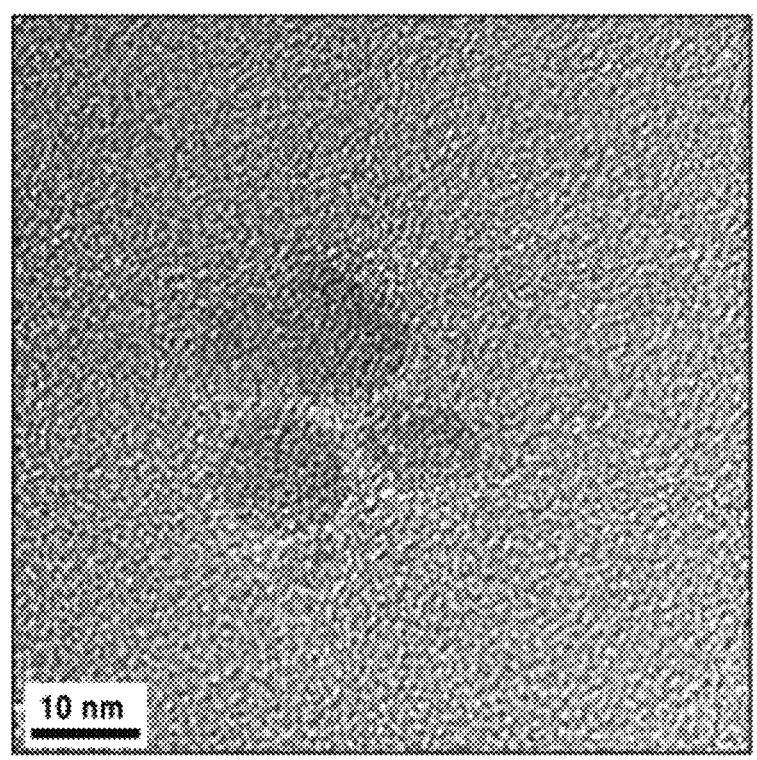

According to FIG. 4A and FIG. 4B, when the carbon tube having 20 cm length was used, a graphene quantum dot in a size of about 20 nm was produced, and when the carbon tube having 5 cm length was used, a graphene quantum dot in a size of about 10 nm was produced. Thus, it was confirmed that the size of the graphene quantum dot to be produced can be controlled by controlling the length of the tube.

Figure 5:
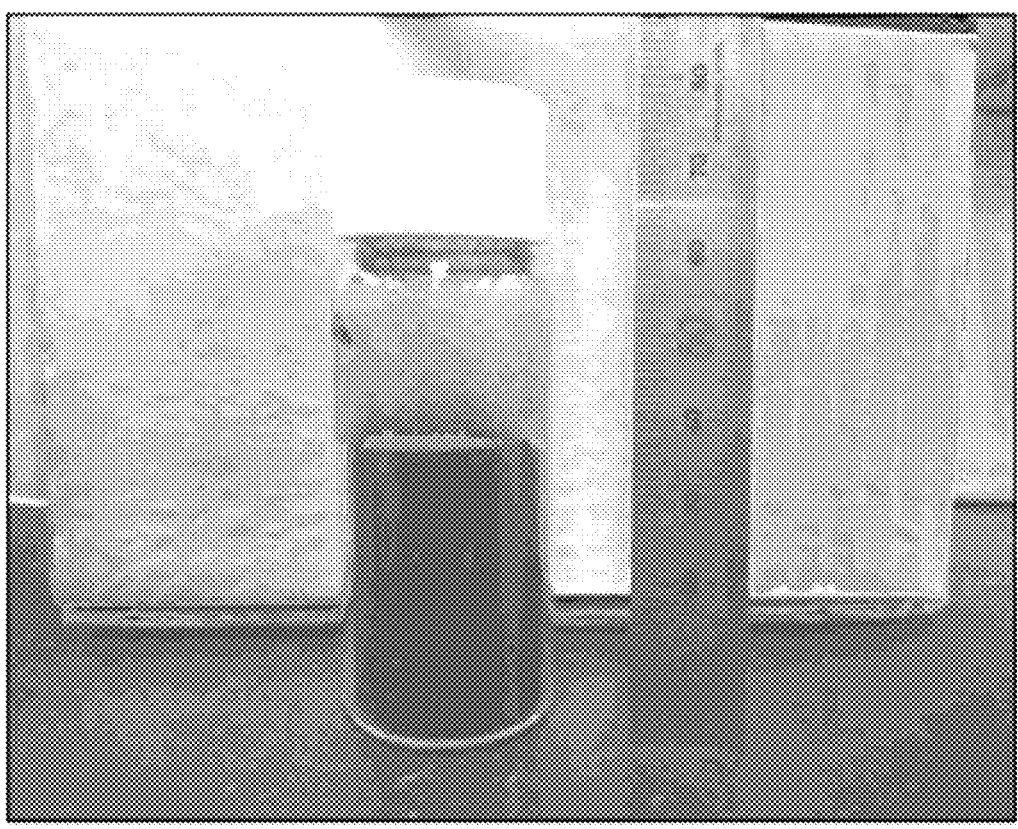
FIG. 5 is a photograph of carbon soots including a graphene quantum dot produced in accordance with an example of the present application disclosure.

FIG. 5 is a photograph of carbon soots obtained by producing the graphene quantum dot using the tube having the 20 cm length for about two (2) minutes. It was confirmed that upon calculating an amount of carbon soots that can be produced per hour based on the production amount and time of the above obtained carbon soots, about 30 g carbon soots can be produced per hour. Since an about 10 wt % graphene quantum dot can be obtained from the carbon soots, it was expected that an about 3 g graphene quantum dot can be produced per hour.

Figure 6:
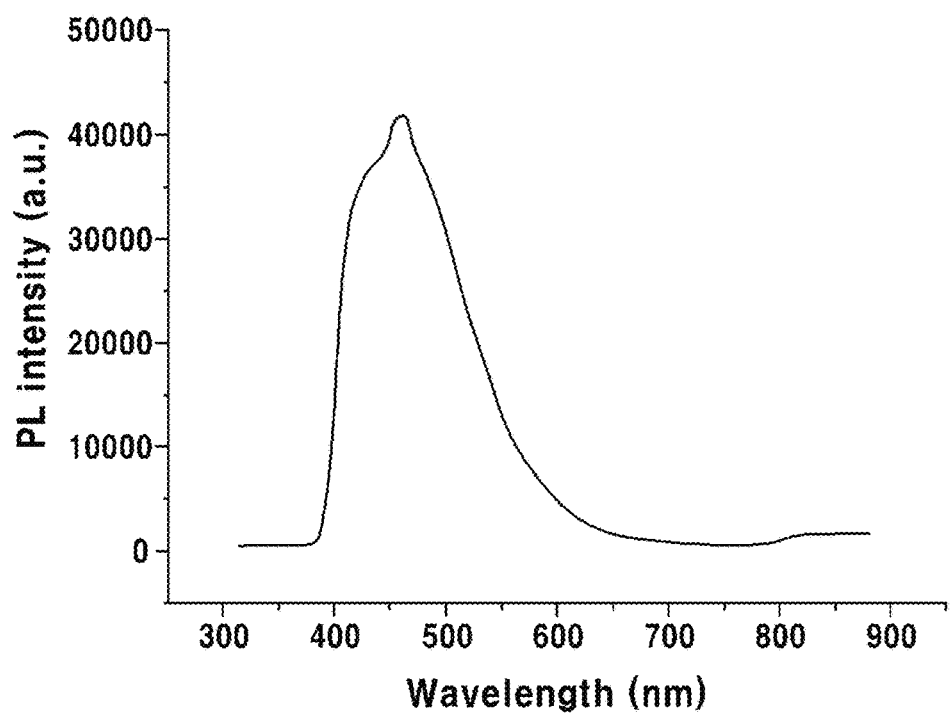
FIG. 6 is a graph showing photoluminescence measured for a graphene quantum dot produced in accordance with an example of the present application disclosure.
Figure 6:
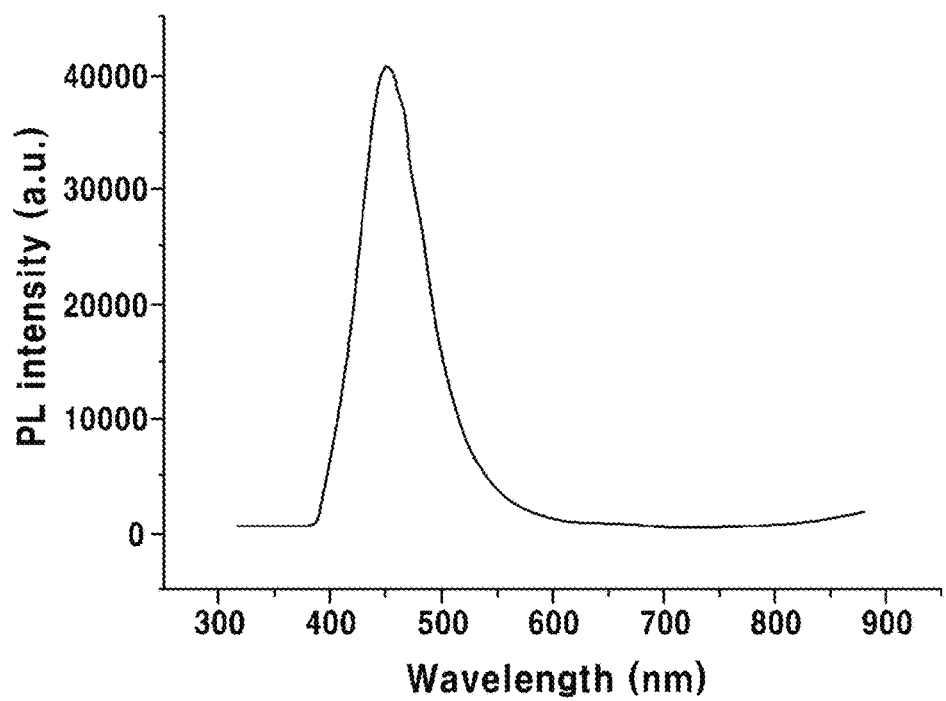

Next, photoluminescence of the graphene quantum dot was measured by using a photoluminescence apparatus including a xenon-arc lamp, a monochromater, and a detector. FIG. 6 shows photoluminescence graphs when the 20 cm (the upper graph) and 5 cm (the lower graph) carbon tubes were used in the present Example. According to a quantum size effect, as the size of the graphene quantum dot increases, the graphene quantum dot emits light of a longer wavelength (less energy). Accordingly, it is possible to predict a relative size of the graphene quantum dot by comparing luminescence wavelengths. According to FIG. 6, it was confirmed that the small sized graphene quantum dot produced by using the 5 cm carbon tube exhibits photoluminescence at a shorter wavelength than that for the large sized graphene quantum dot produced by using the 20 cm carbon tube. That is, when a graphene quantum dot was produced by using the 20 cm carbon tube, compared to using the 5 cm carbon tube, a larger sized graphene quantum dot was produced.

Control of a size of the graphene quantum dot according to controlling of a length of the tube (2)

In the present Example, the graphene quantum dot was produced by controlling the length of the carbon tube to be 5 cm, 10 cm and 20 cm, respectively.

Figure 7A:
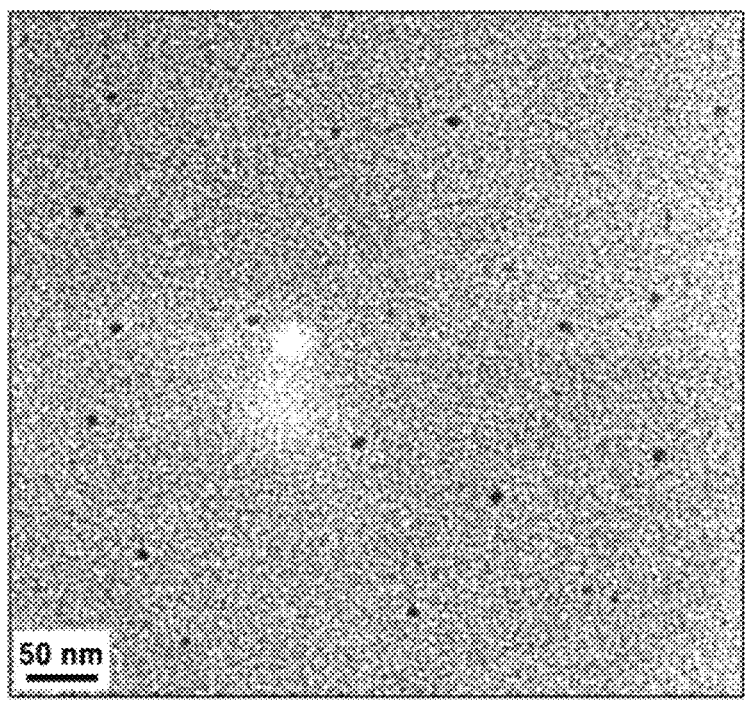
FIG. 7A and FIG. 7B are transmission electron microspore images of a graphene quantum dot produced by controlling a length of a tube in accordance with an example of the present application disclosure.
Figure 7B:
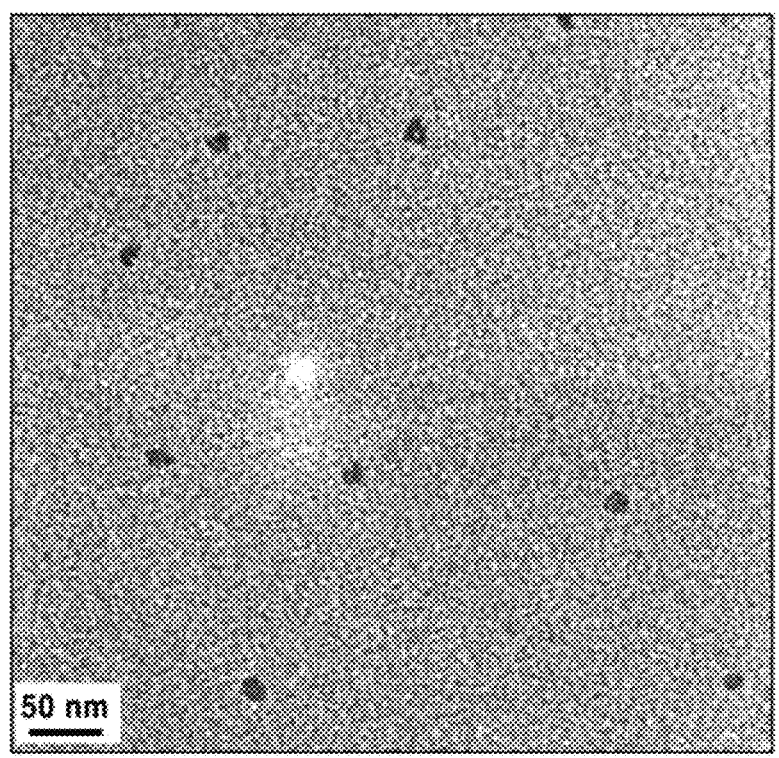

FIG. 7A and FIG. 7B are transmission electron microscope images of the graphene quantum dot produced by using the 5 cm carbon tube. In FIG. 7A, from about 8 nm to about 10 nm graphene quantum dots were observed, and in FIG. 7B, from about 15 nm or less graphene quantum dots were observed.

Figure 8A:
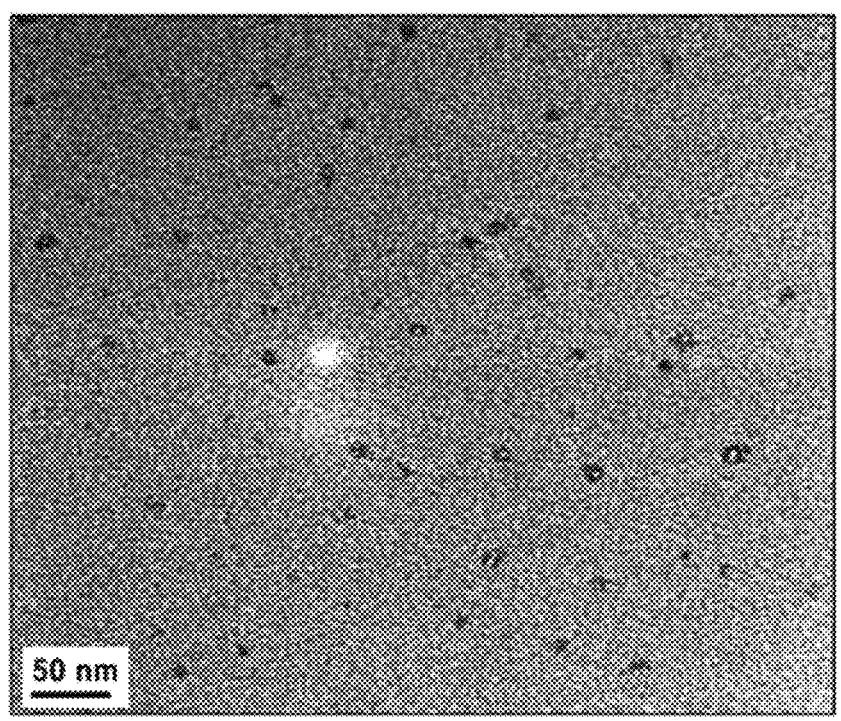
FIG. 8A to FIG. 8C are transmission electron microspore images of a graphene quantum dot produced by controlling a length of a tube in accordance with an example of the present application disclosure.
Figure 8B:
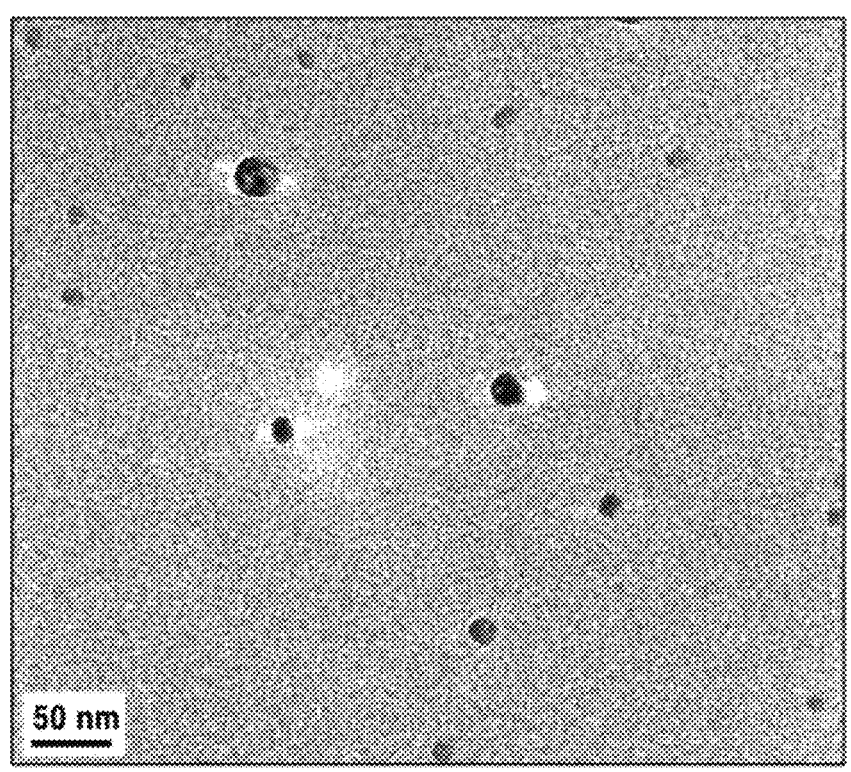
Figure 8C:
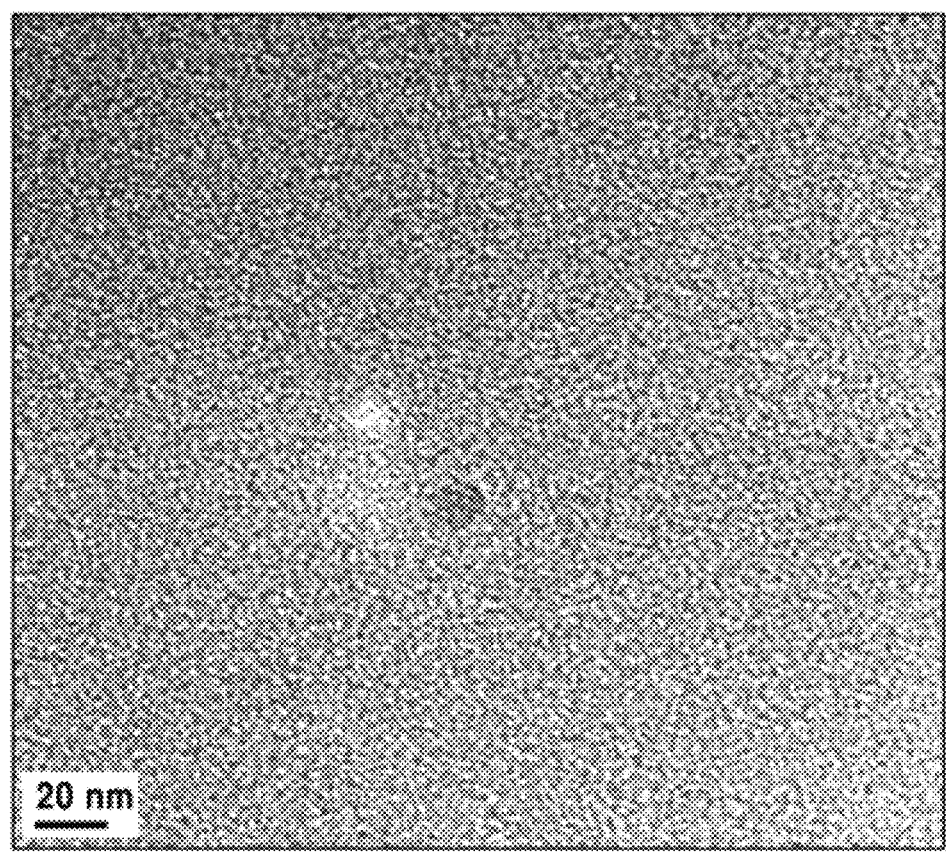

FIG. 8A to FIG. 8C are transmission electron microscope images of the graphene quantum dot produced by using the 10 cm carbon tube. In FIG. 8A, graphene quantum dots in a size of about 14 nm or less were observed; in FIG. 8B, graphene quantum dots in sizes of about 14 nm, about 17 nm, and about 25 nm, respectively, were observed; and in FIG. 8C, graphene quantum dots in a size of about 14 nm were observed.

Figure 9A:
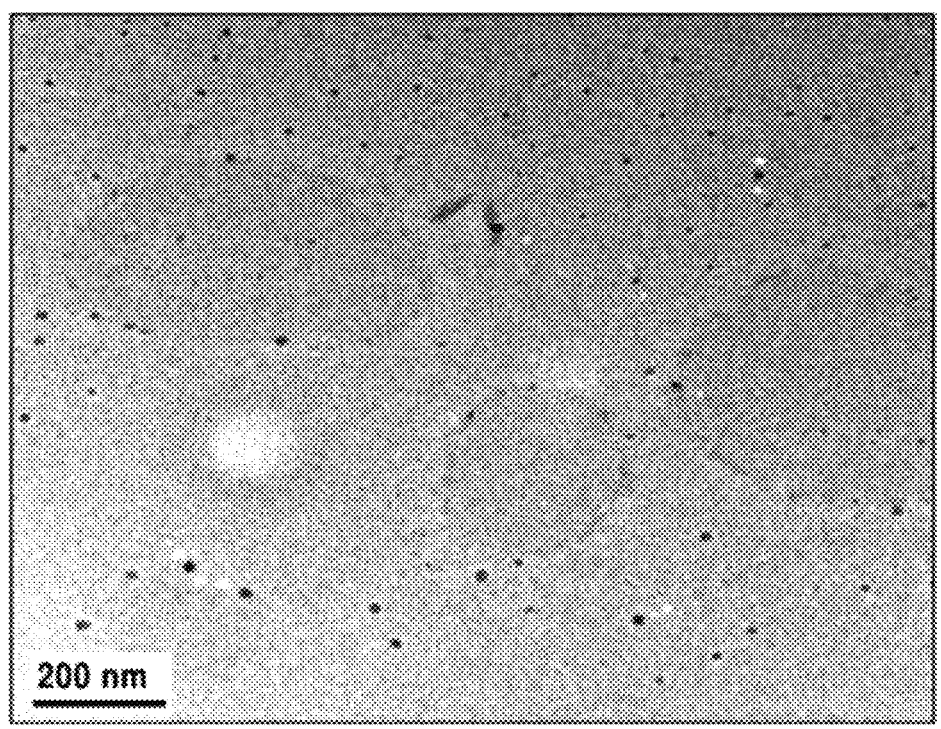
FIG. 9A to FIG. 9C are transmission electron microspore images of a graphene quantum dot produced by controlling a length of a tube in accordance with an example of the present application disclosure.
Figure 9B:
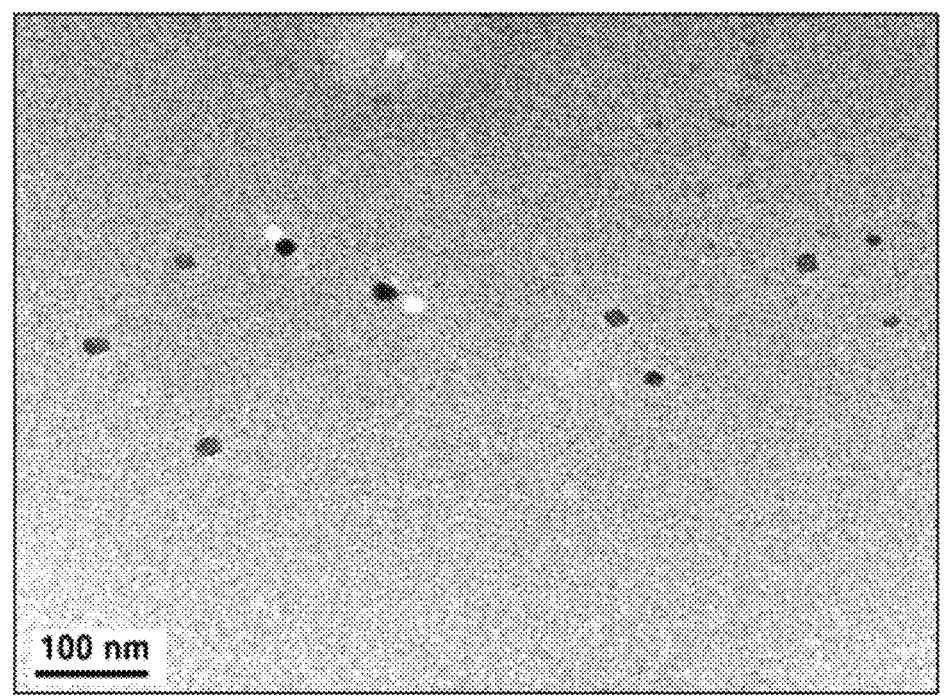
Figure 9C:
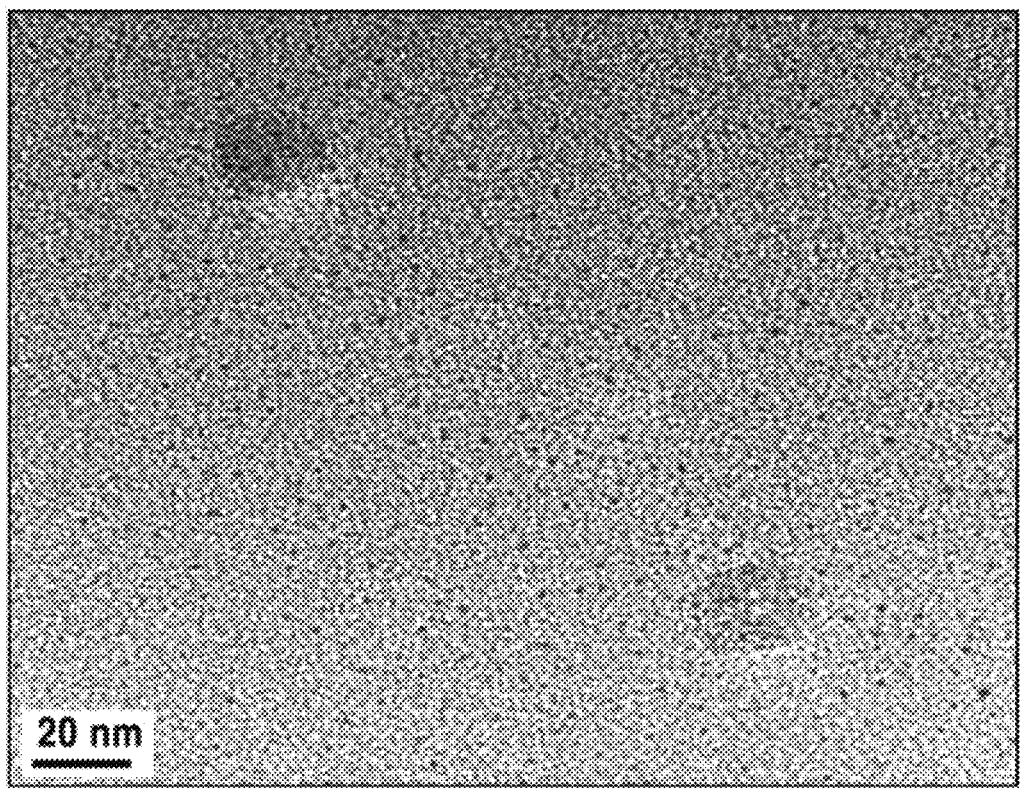

FIG. 9A to FIG. 9C are transmission electron microscope images of graphene quantum dots produced by using the 20 cm carbon tube. In FIG. 9A, graphene quantum dots in a size of from about 12 nm to about 20 nm were observed; in FIG. 9B, graphene quantum dots in a size of from about 20 nm to about 25 nm were observed; and in FIG. 9C, graphene quantum dots in a size of about 24 nm were observed. In light of the foregoing results, it was confirmed that the size of the graphene quantum dots to be produced can be controlled with high accuracy by controlling the length of the tube.

Characterization of the produced graphene quantum dots.

Figure 10:
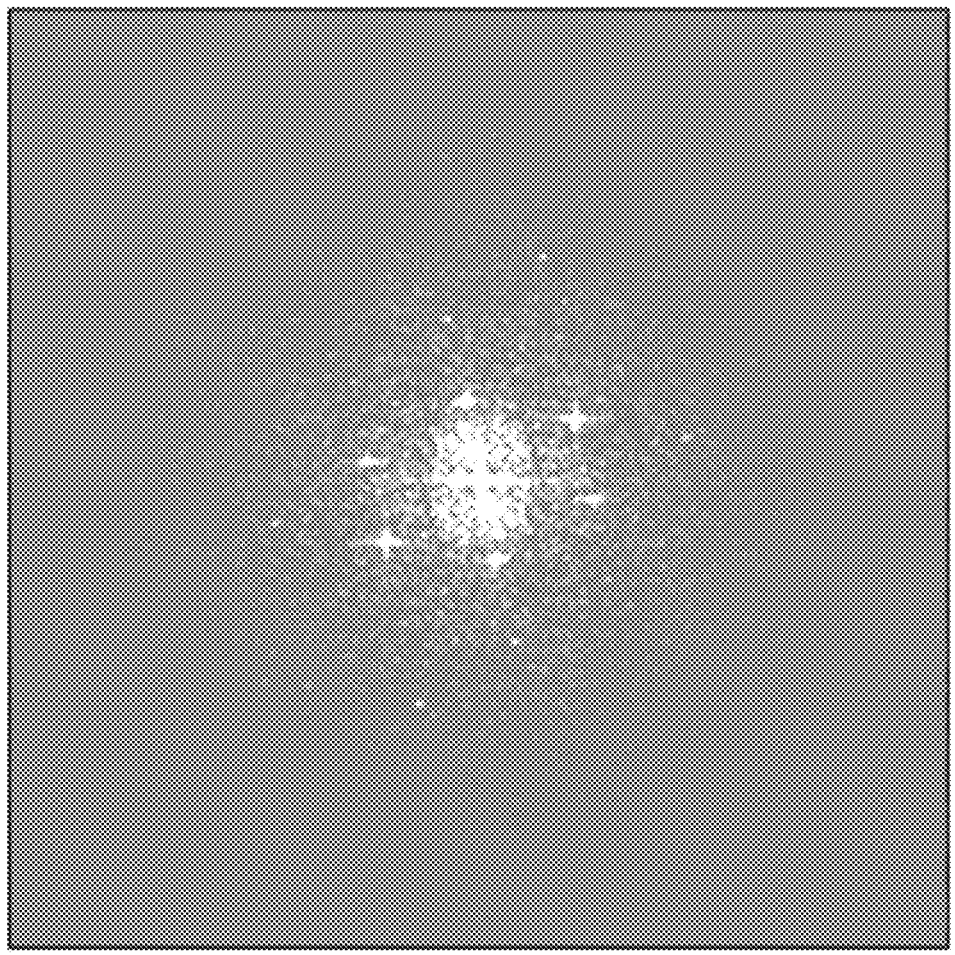
FIG. 10 is an image of 2D fast Fourier transform (FFT) analysis of a graphene quantum dot produced in accordance with an example of the present application disclosure.

Images of the graphene quantum dots produced by the above Example were obtained by using a transmission electron microscope (TEM), and simultaneously, 2D FFT thereof was measured. From the measured diffraction patterns, it can be identified whether the graphene quantum dots is a single layer or multilayer. FIG. 10 is a 2D fast Fourier transform (FFT) analysis image for the produced graphene quantum dots, and according to the diffraction patterns, it was confirmed that the graphene quantum dots were formed as a single layer.

Figure 11:
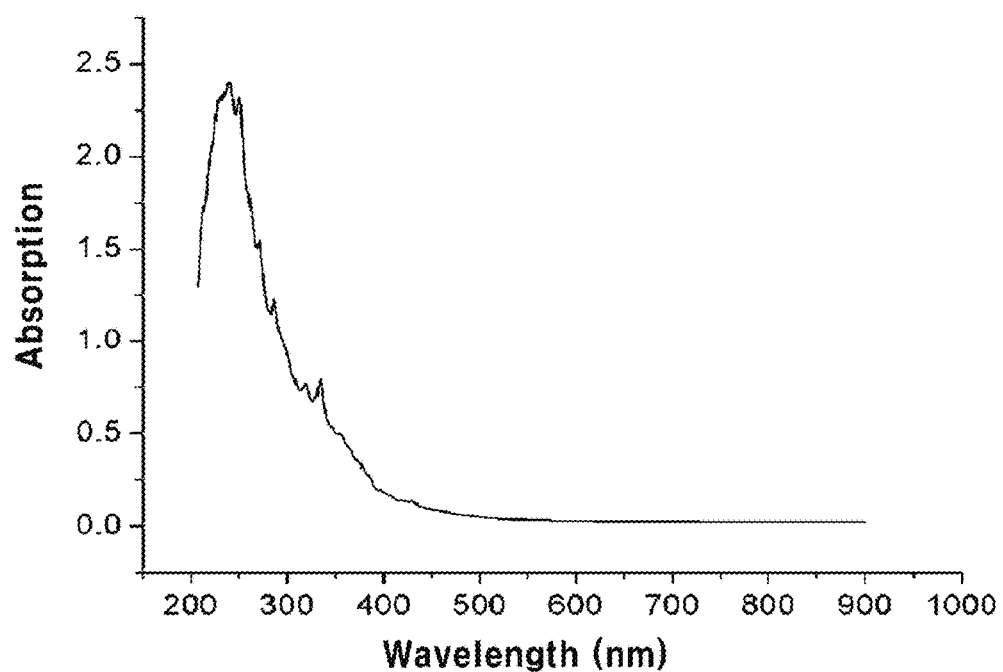
FIG. 11 is a graph showing ultraviolet-visible light absorbance measured for a graphene quantum dot produced in accordance with an example of the present application disclosure.

FIG. 11 is an absorption spectrum obtained from measuring ultraviolet-visible light absorbance of the graphene quantum dot produced by the above Example by using an ultraviolet-visible light spectroscope. According to FIG. 11, it was confirmed that the graphene quantum dot absorbs about 320 nm and about 280 nm light.

Figure 12:
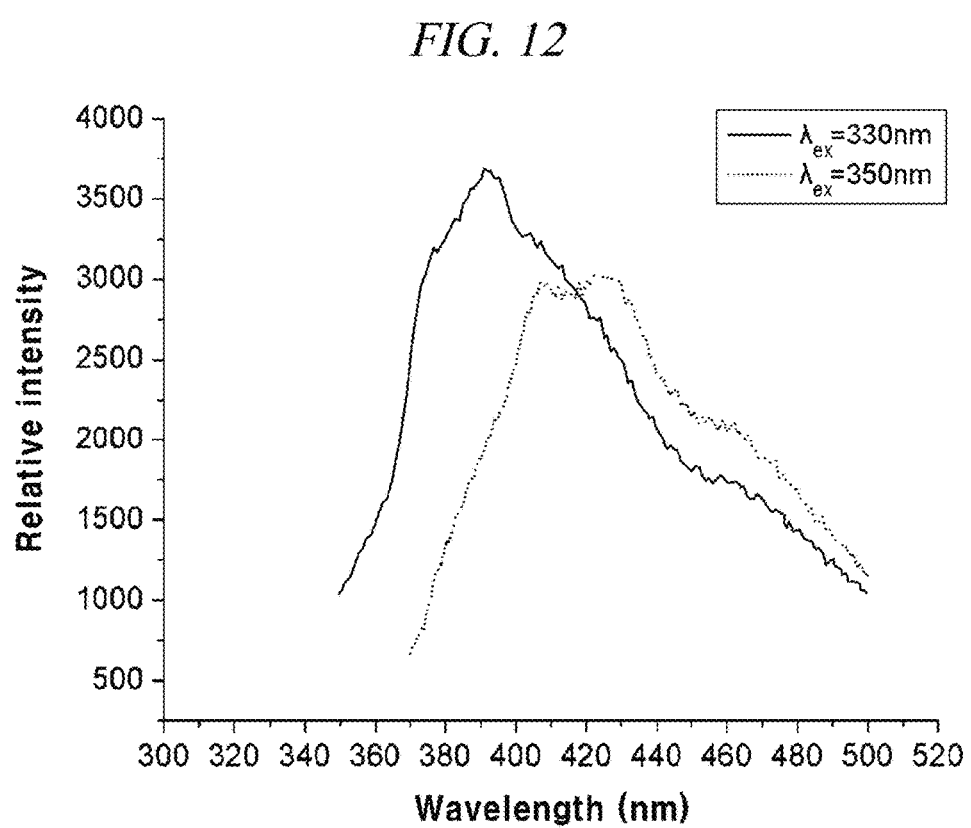
FIG. 12 is a graph showing photoluminescence measured for a graphene quantum dot produced in accordance with an example of the present application disclosure.

FIG. 12 is a graph obtained from measuring photoluminescence of the produced graphene quantum dot. According to FIG. 12, it was confirmed that the graphene quantum dot emits light in blue.

Example 2

Figure 15:
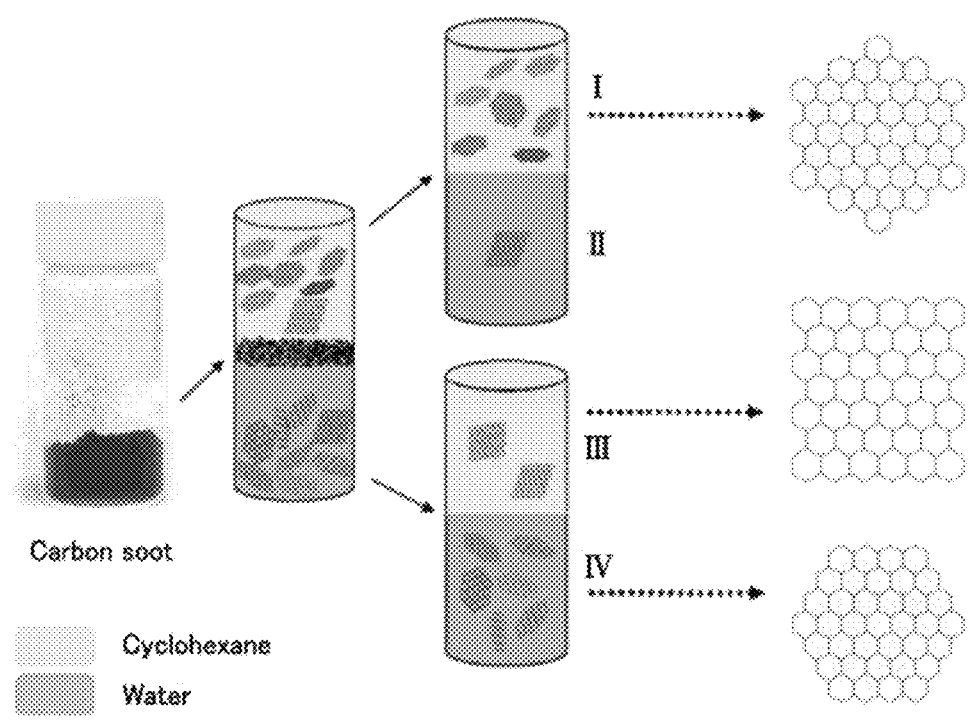
FIG. 15 is schematic diagram of a liquid-liquid extraction of three types of GQDs from carbon soot produced: four solutions (I-IV) are denoted as cyclohexane/cyclohexane, cyclohexane/water, water/cyclohexane, and water/water solutions in accordance with an example of the present application disclosure.

Isolation of Each of Different Graphene Quantum Dots Prepared Using Thermal Plasma Carbon soot containing GQDs were fabricated using a thermal plasma system. A carbon tube (10 cm in length; 2 cm in diameter) was attached to an anode and ethylene gas was flowed continuously (2.5 L min$^{-1}$) as a carbon source into a torch through a gas flow meter (FIG. 1). For the extraction of GQDs, a small amount of carbon soot was scattered carefully on the surface of water contained in a vial, and then cyclohexane was added carefully to minimize disturbance (FIG. 15). After waiting for 48 h, two layers were separated without any undissolved carbon soot. For further purification, cyclohexane was added to the separated aqueous phase, while water was added to the organic phase. The volume ratio of water and cyclohexane was about 1:1. GQDs were analyzed using a high-resolution transmission electron microscope (TEM; JEOL, JEM-3000F (300 kV)). The photoluminescence (PL) and photoluminescence excitation (PLE) spectra were obtained using a homemade spectrophotometer. Absolute quantum yield was measured by an absolute PL quantum yield measurement system QE-1200 (OTSUKA Electronics). Atomic force microscopy (AFM) images were obtained using a PSIA (XE-150) atomic force microscope. X-ray photoelectron spectroscopy (XPS) analysis was performed using a PHI 5000 VersaProbe™ ULVAC system with an Al Kα X-ray source (hv=1486.6 eV), which obtained a 15 kV and 20 mA beam, and an HSA analyzer.

Figure 16:
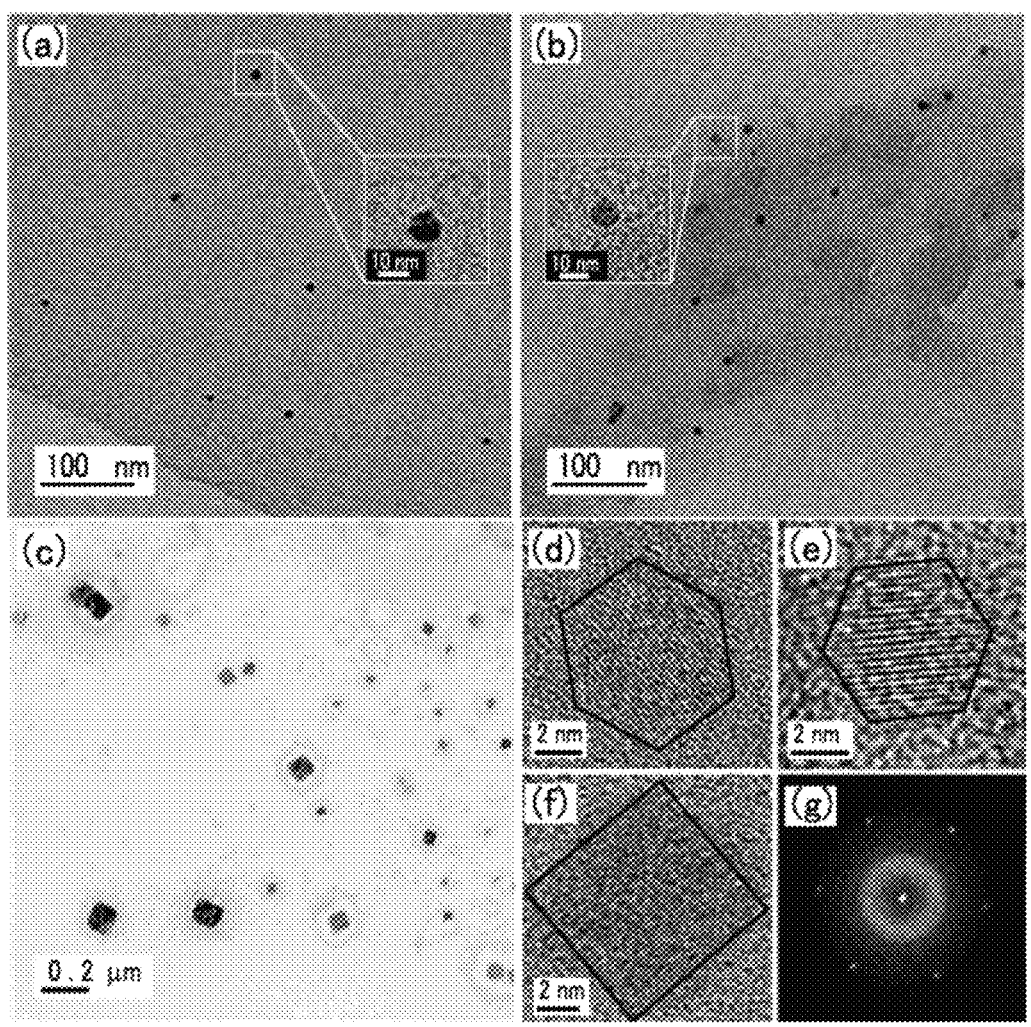
FIG. 16 is low- and high-resolution TEM images of armchair (or nonpolar hexagonal) ((a) and (d) of FIG. 16), zigzag (or polar hexagonal) ((b) and (e) of FIG. 16) and hybrid (or amphoteric rectangular) ((c) and (f) of FIG. 16) GQDs, and 2D FFT pattern of a zigzag GQD ((g) of FIG. 16) in accordance with an example of the present application disclosure.
Figure 17:
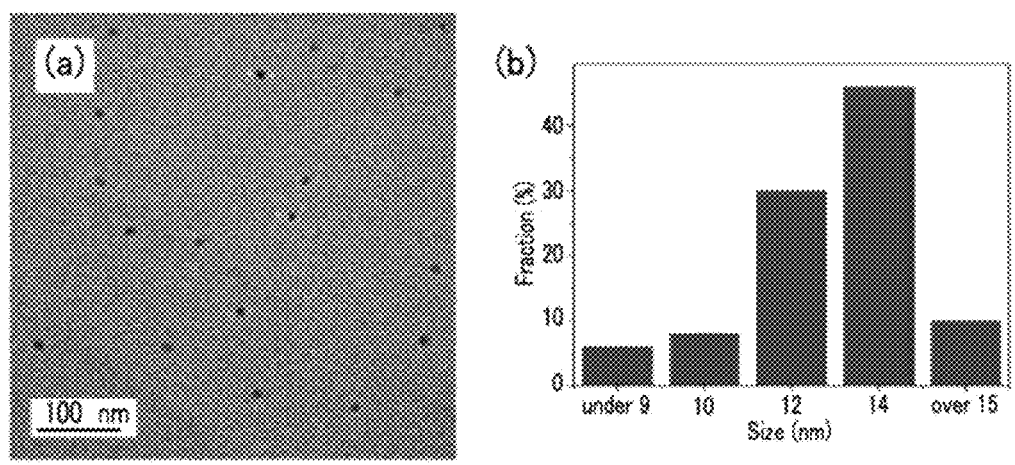
FIG. 17 is a low-resolution TEM images and size distribution histogram of armchair GQDs: the average size is about 13 nm in accordance with an example of the present application disclosure.
Figure 18:
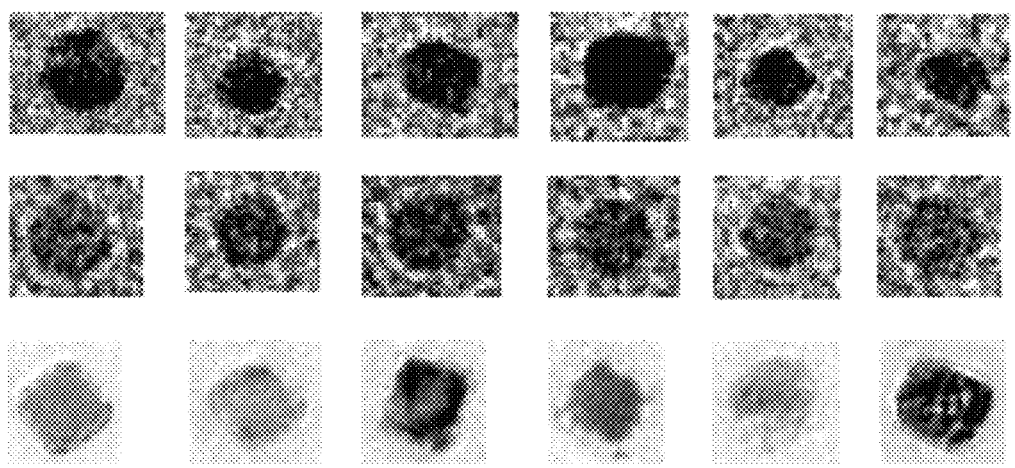
FIG. 18 is TEM images to show shapes of (top row) armchair, (middle row) zigzag, and (bottom row) hybrid GQDs in accordance with an example of the present application disclosure.
Figure 19:
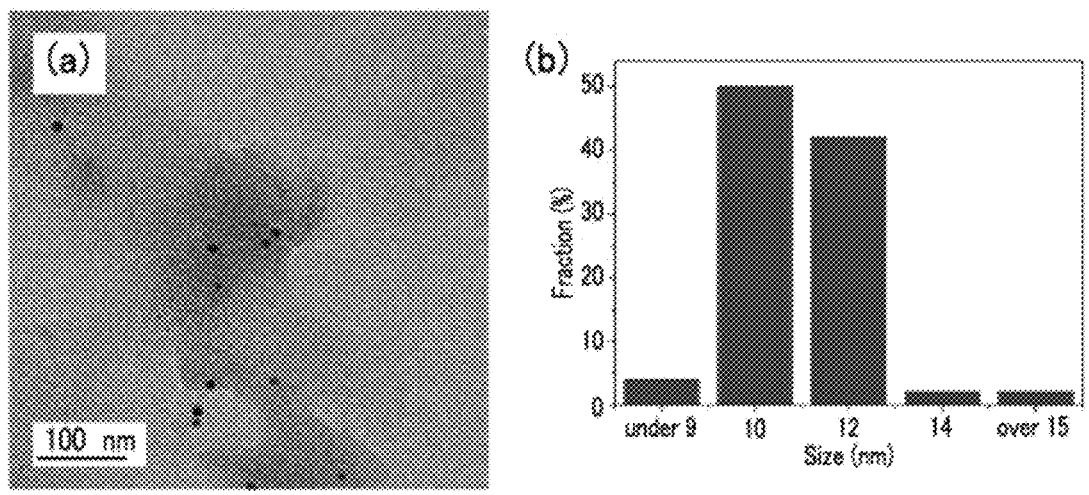
FIG. 19 is a low-resolution TEM images and size distribution histogram of zigzag GQDs: the average size is about 11 nm in accordance with an example of the present application disclosure.
Figure 20:
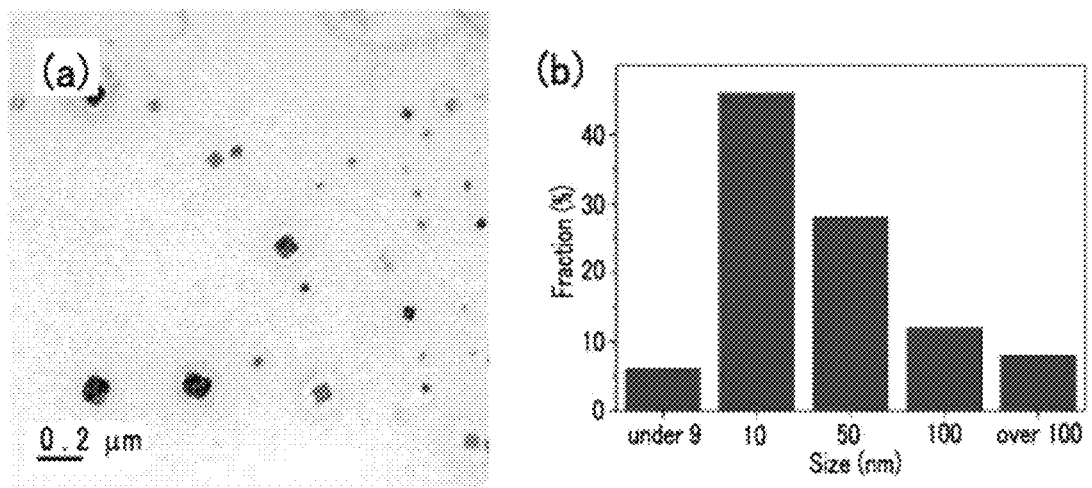
FIG. 20 is a low-resolution TEM images and size distribution histogram of hybrid GQDs: the average size is about 53 nm in accordance with an example of the present application disclosure.
Figure 21:
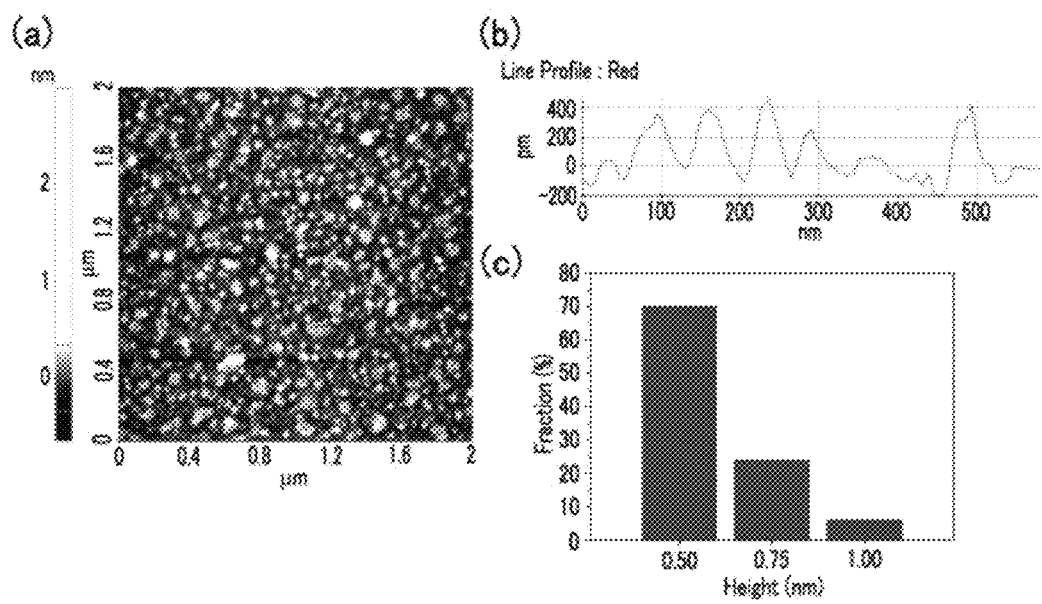
FIG. 21 is AFM image, height profile, and height distribution histogram of armchair GQDs in accordance with an example of the present application disclosure.
Figure 22:
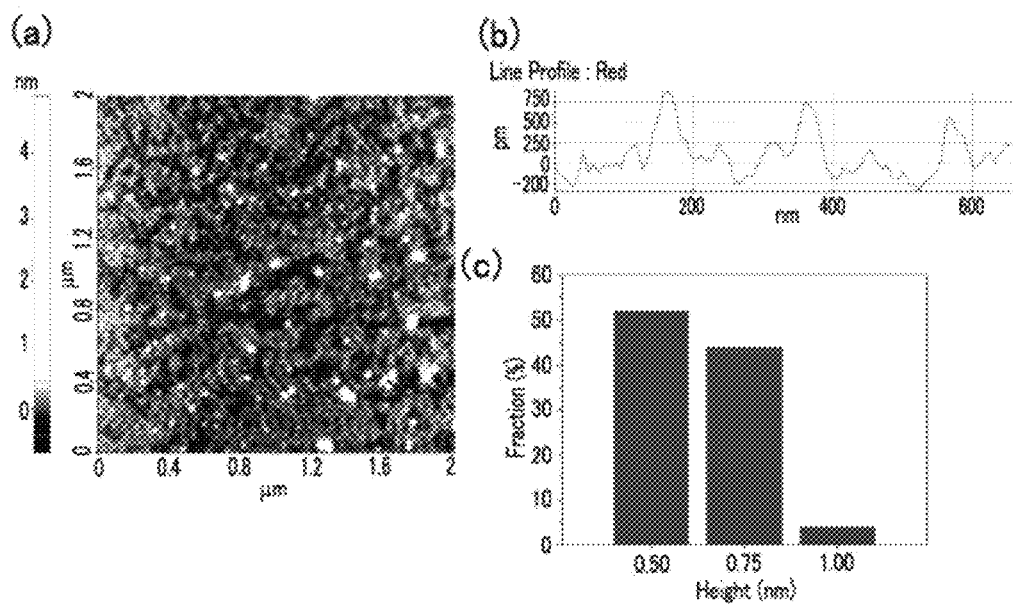
FIG. 22 is AFM image, height profile, and height distribution histogram of zigzag GQDs in accordance with an example of the present application disclosure.
Figure 23:
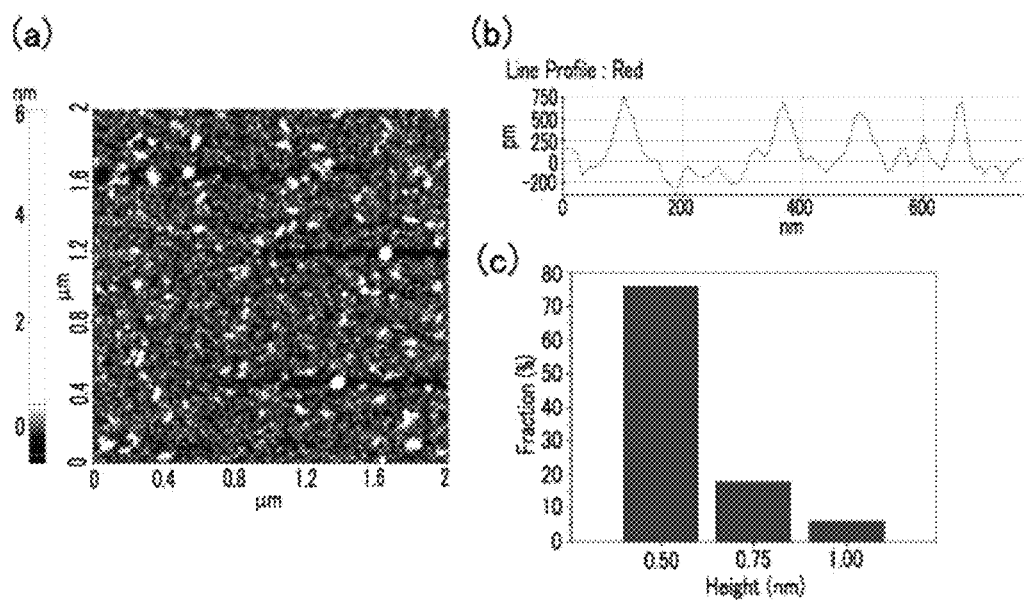
FIG. 23 is AFM image, height profile, and height distribution histogram of hybrid GQDs in accordance with an example of the present application disclosure.
Figure 24:
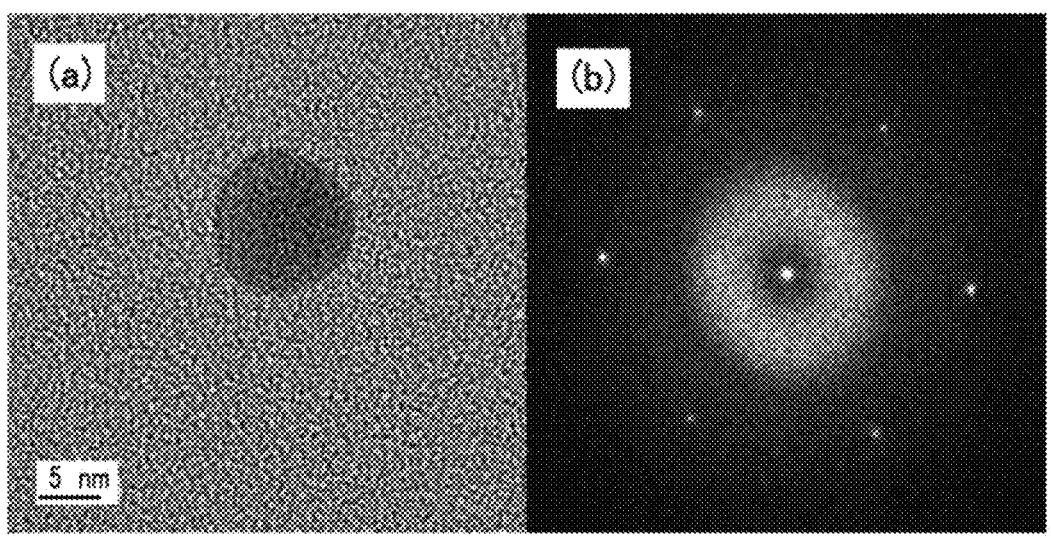
FIG. 24 is HRTEM image and the 2D FFT pattern of armchair GQD in accordance with an example of the present application disclosure.
Figure 25:
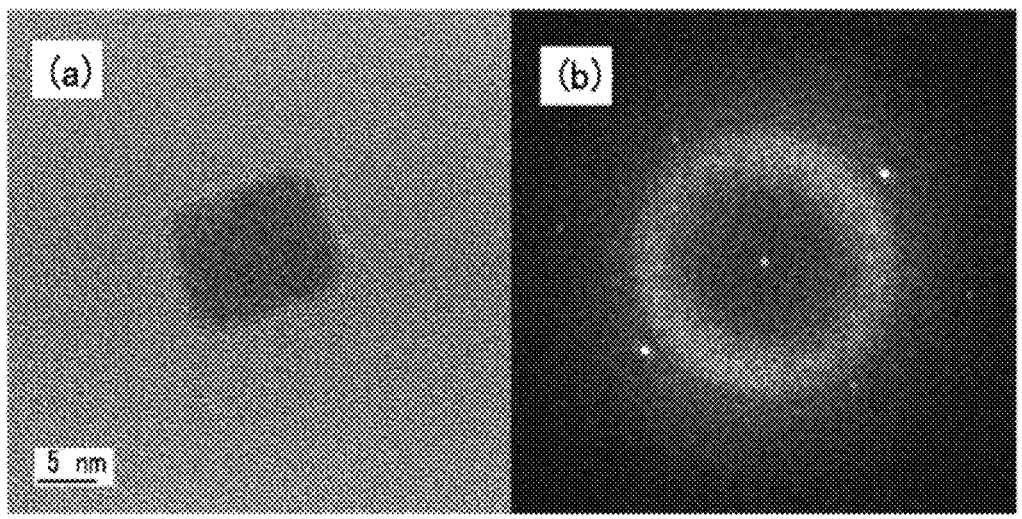
FIG. 25 is HRTEM image and the 2D FFT pattern of hybrid GQD in accordance with an example of the present application disclosure.
Figure 26:
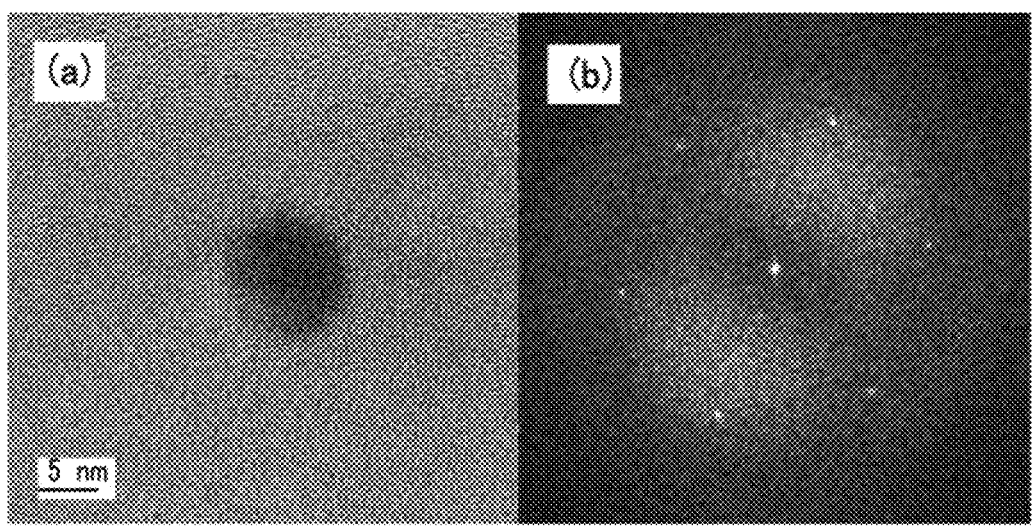
FIG. 26 is HRTEM image and the 2D FFT pattern of zigzag GQD in accordance with an example of the present application disclosure.
Figure 27A:
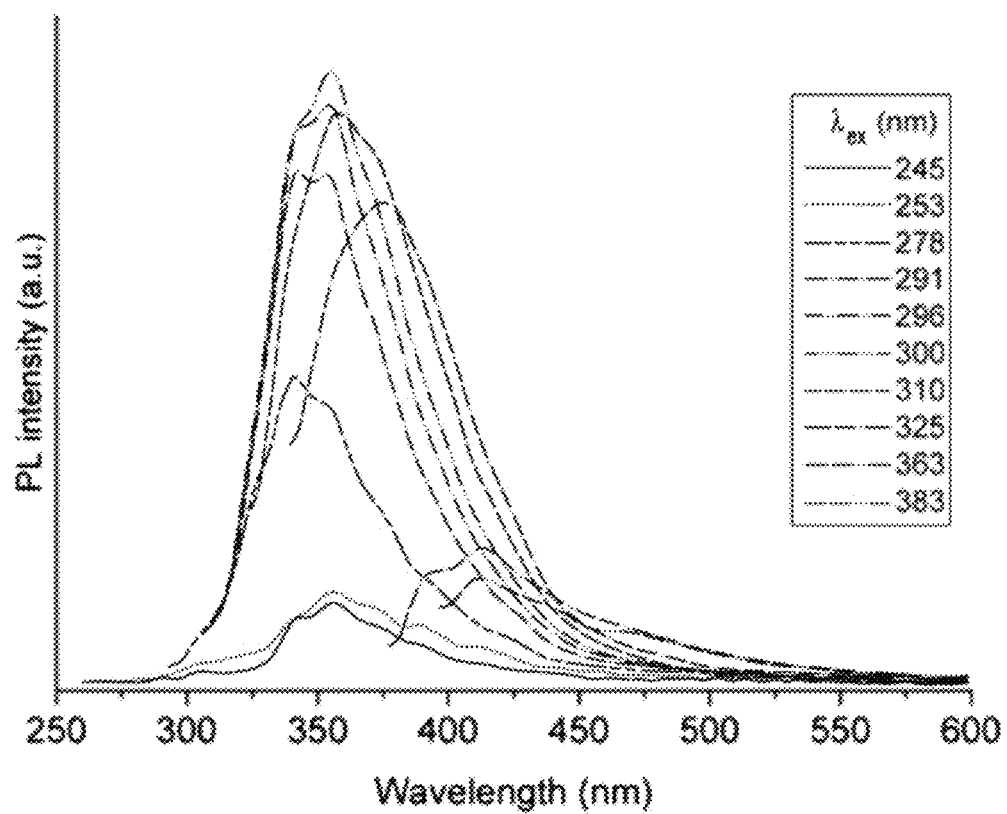
FIG. 27A to FIG. 27C are PL spectra of (a) zigzag (or polar hexagonal) (FIG. 27A), (b) armchair (or nonpolar hexagonal) (FIG. 27B), and (c) hybrid (or amphoteric rectangular) (FIG. 27C) GQDs in accordance with an example of the present application disclosure: ethanol was used as the solvent for all the samples, and the legends are the excitation wavelengths.
Figure 27B:
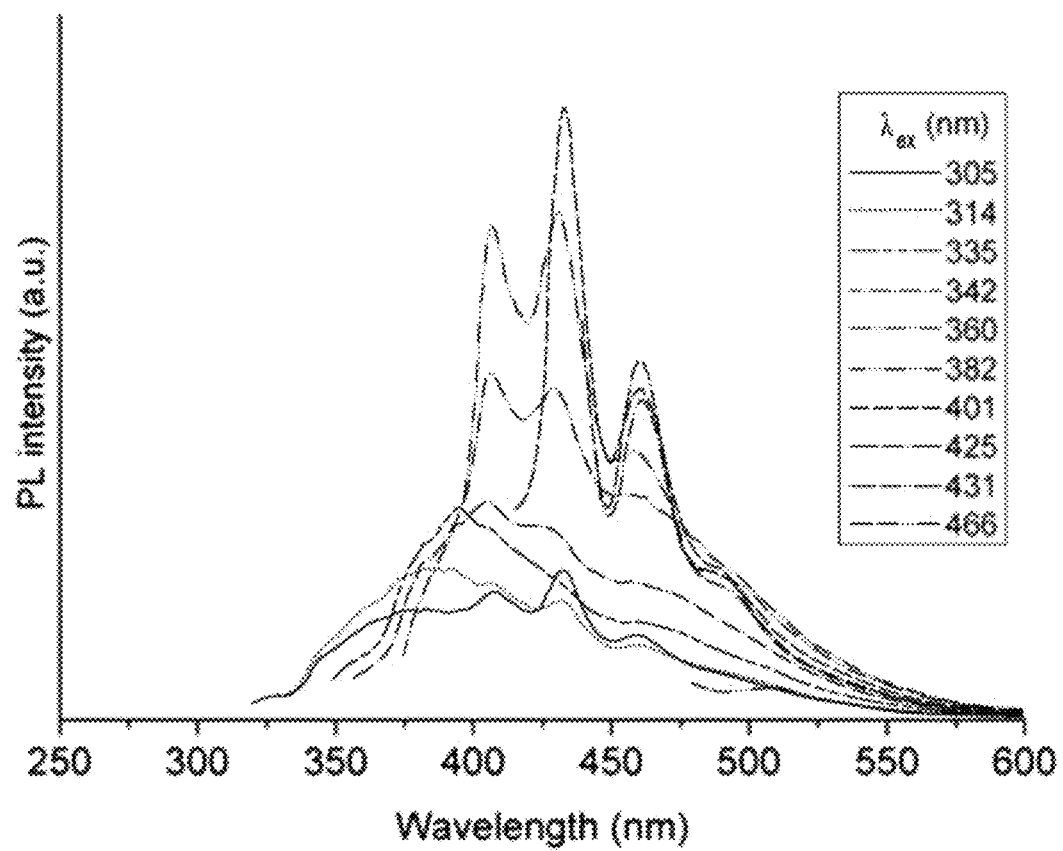
Figure 27C:
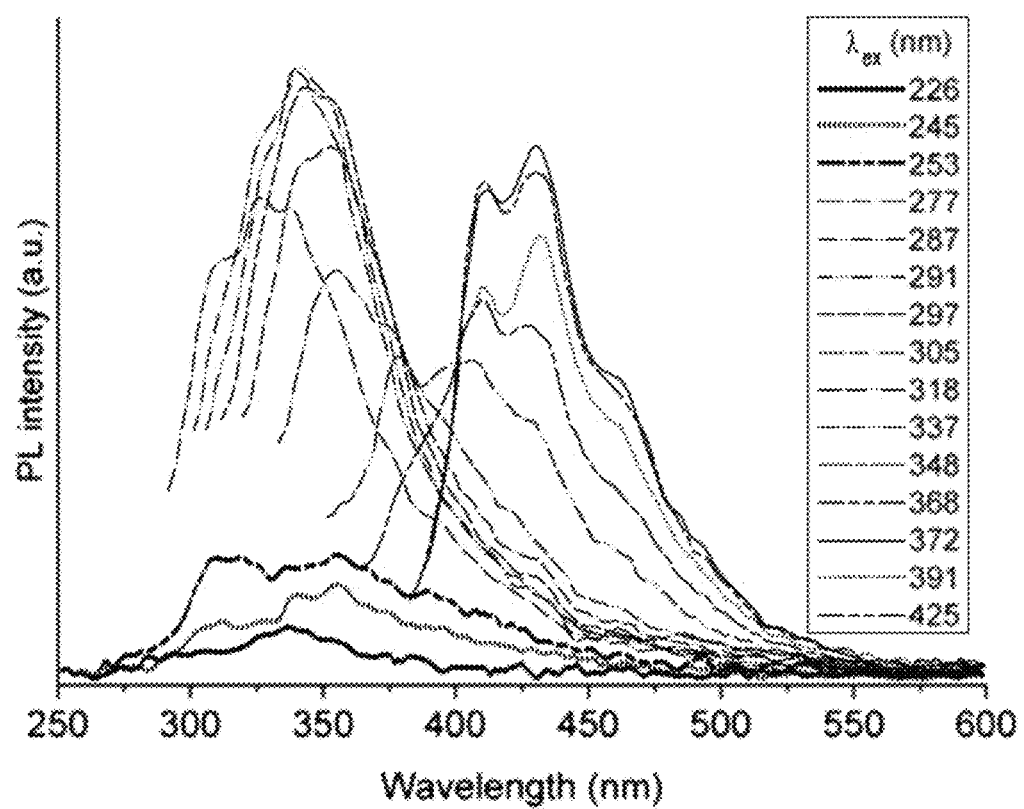
Figure 28A:
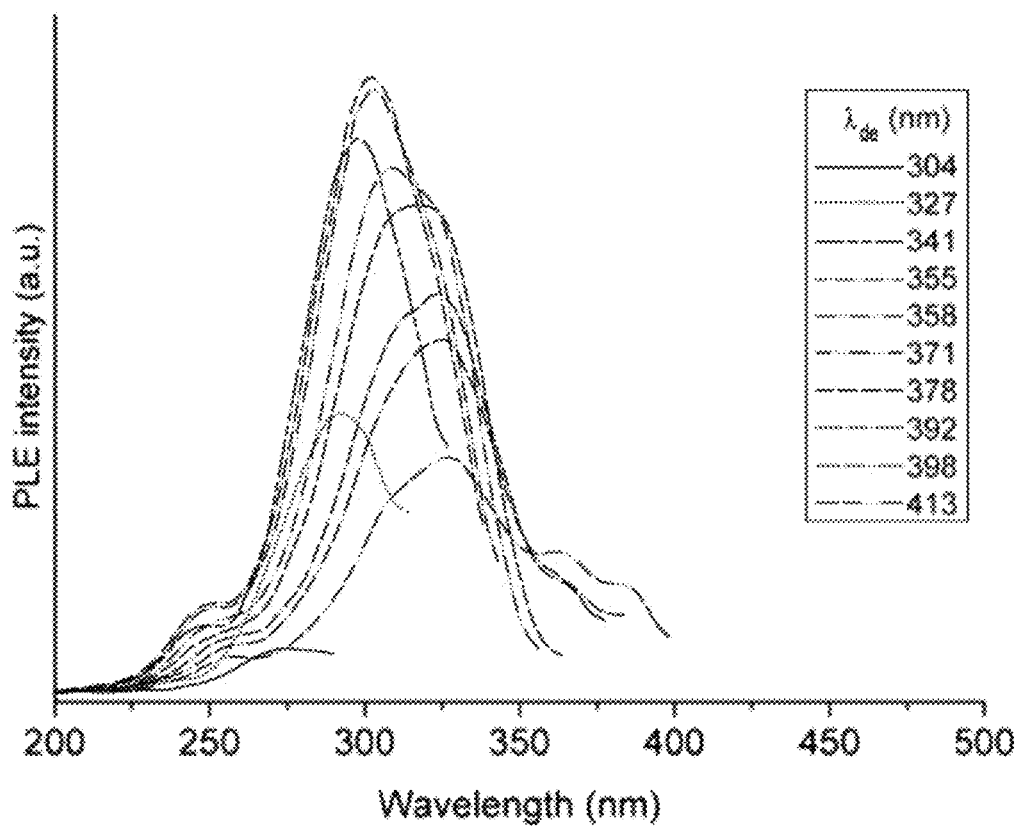
FIG. 28A to FIG. 28C are PLE spectra of (a) zigzag (or polar hexagonal) (FIG. 28A), (b) armchair (or nonpolar hexagonal) (FIG. 28B), and (c) hybrid (or amphoteric rectangular) (FIG. 28C) GQDs in accordance with an example of the present application disclosure: ethanol was used as the solvent for all the samples, and the legends are the excitation wavelengths.
Figure 28B:
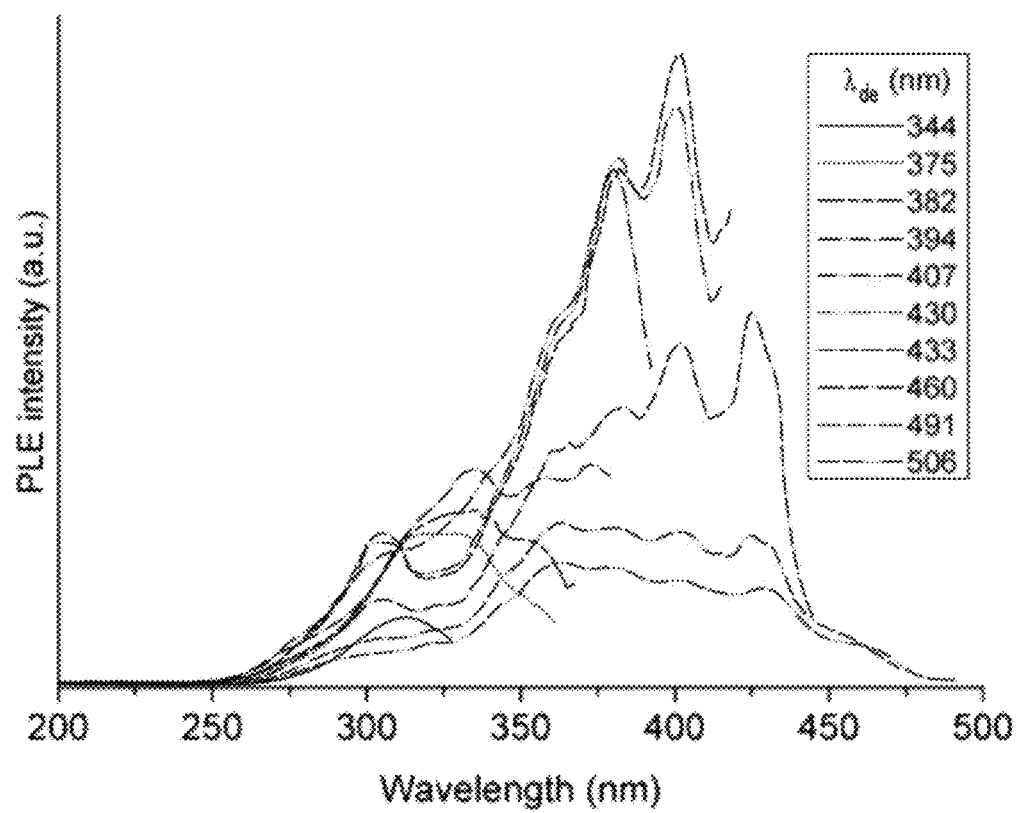
Figure 28C:
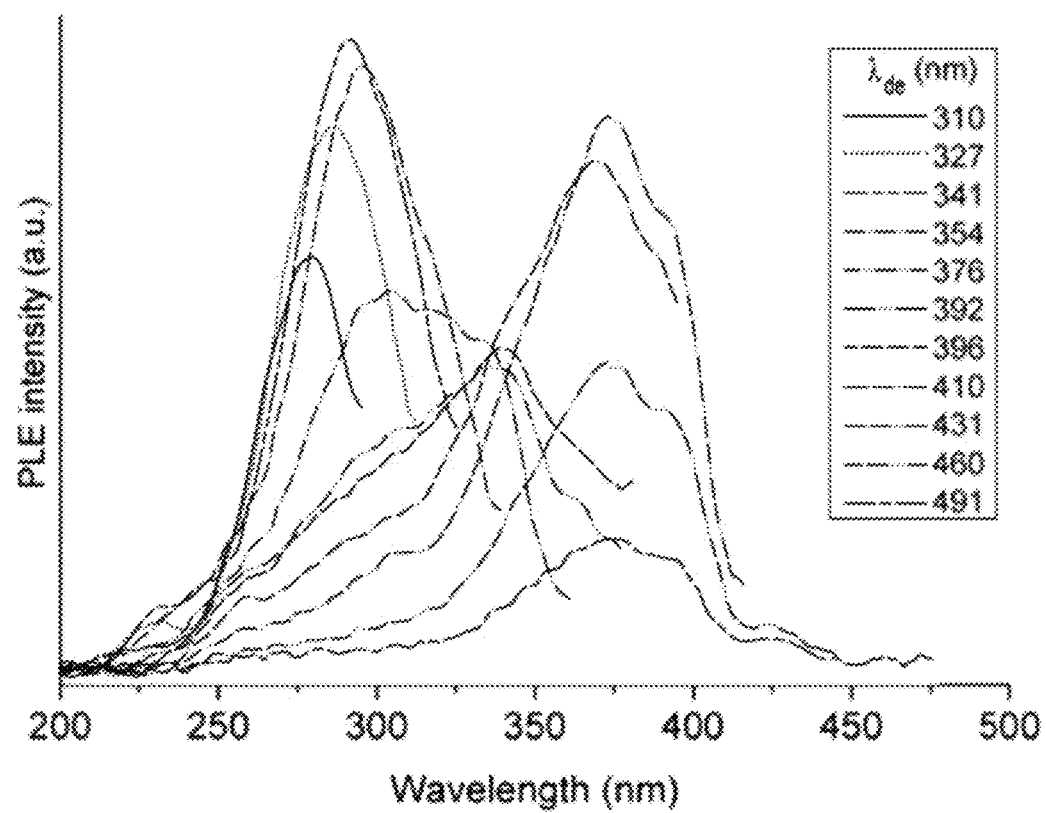

FIG. 16 shows the low ((a)-(c) of FIG. 16) and high ((d)-(f) of FIG. 16) resolution TEM images of GQDs and ((g) of FIG. 16) the fast Fourier transform (FFT) pattern of a GQD. GQDs were extracted from the carbon soot produced using the liquid-liquid extraction method. Water and cyclohexane were used as polar and nonpolar solvents, respectively. It should be mentioned that the dominant species in carbon soot is the onion-type carbon material, which does not disperse without sonication. Four solutions containing GQDs were denoted as cyclohexane/cyclohexane, cyclohexane/water, water/cyclohexane, and water/water solutions (FIG. 15). The GQDs included in the cyclohexane/cyclohexane solution could be dissolved favorably in a nonpolar solvent, while those included in the water/water solution dissolved favorably in a polar solvent. GQDs included in the solutions of cyclohexane/water or water/cyclohexane solution could be dissolved in both polar and nonpolar solvents. In the cyclohexane/water solution, we could not observe GQDs due to very low concentration even though the solution showed very weak fluorescence. GQDs shown in (a) of FIG. 16 were obtained from the cyclohexane/cyclohexane solution. Their average size is about 13 nm (FIG. 17). Although the corners are not well developed, one can clearly see sides from all GQDs. They have basic hexagonal shapes (FIG. 18). GQDs shown in (b) of FIG. 16 have been obtained from the water/water solution. Their average size is about 11 nm (FIG. 19). They also have basic hexagonal shapes (FIG. 18). Some look circular in shape. This may be due to the fact that hexagonal shapes appear as circular shapes when the corners are not well developed. It should be mentioned that GQDs were made by collisions of carbon atoms. Therefore, the corners could not be obtained clearly, as shown in FIG. 13. GQDs shown in (c) in FIG. 16 have rectangular shapes. They have been obtained from the water/cyclohexane solution. Their shape is relatively uniform as squares but their size has a large distribution. The largest one is about 300 nm, while the smallest one is about 15 nm. The large ones may be too big to be called GQDs. The average size is about 53 nm (FIG. 20). It should be mentioned that the average size of GQDs could be controlled by varying the length of the carbon tube attached to the anode. It is known that the average size of GQDs increases with increasing the length of the carbon tube attached to the anode. In high-resolution TEM images of the three types of GQDs, uniform lattice fringes are clearly seen. By AFM analysis, it was observed that the three kinds of GQDs are all single-layered. The height profiles of the lines in FIG. 21 to FIG. 23 show that the thickness of the GQDs is less than 1 nm, which is in good agreement with the reported value for single-layered graphene. The corresponding FFT patterns of GQDs are shown in (g) of FIG. 16 and FIG. 24 to FIG. 26. They show a hexagonal pattern without any satellite spots.

XPS was performed to determine the composition of all the three kinds of GQDs. The obtained spectra could be deconvoluted into four surface components, corresponding to $sp^2$ (C═C) at the binding energy of 284.5 eV, $sp^3$ (C—C, and C—H) at 285.5 eV, C—OH at 286.6 eV, as well as O═C—OH at 288.6 eV. The bands corresponding to C—OH and O═C—OH were relatively weak. In principle, oxygen is not contained in our fabrication, because only Ar and ethylene gases have been added into a plasma system as the plasma gas and carbon source, respectively. Actually, according to the energy-dispersive X-ray spectroscopy (EDS) analysis of carbon soot including the three kinds of GQDs, no oxygen is observed in the carbon soot that is not exposed to air.[40] Therefore, oxygen of the hydroxyl and carboxyl groups might be involved during the preparation process of XPS samples. It should be mentioned that H termination could occur because the number of hydrogen atoms generated is twice that of carbon atoms when ethylene molecules are decomposed. However, we could not obtain any information that is helpful in explaining the polar or nonpolar characters of GQDs or any evidence of the H termination from the analysis of XPS or Raman spectra. This may be due to the fact that the number of edge carbon or hydrogen atoms is relatively very small compared to the total number of carbon atoms of GQDs.

The shapes and dissolving property of the three types of GQDs agreed well with those predicted from the GQDs model (FIG. 13). Therefore, it is concluded that the GQDs obtained from the cyclohexane/cyclohexane solution are armchair (or nonpolar hexagonal) GQDs having carbyne edges. GQDs obtained from the water/water solution are zigzag (or polar hexagonal) GQDs having carbene edges. On the other hand, GQDs obtained from the water/cyclohexane solution are hybrid (or amphoteric rectangular) GQDs having carbyne and carbene edges in each dot. Our conclusion is supported by the PL and PLE data. It is known that the PL of GQDs is determined by the edge structures. Hybrid GQDs have both carbyne and carbene edges in each dot. Therefore, the PL spectra of hybrid GQDs may show the characteristic peaks corresponding to both armchair and zigzag GQDs.

Figure 29:
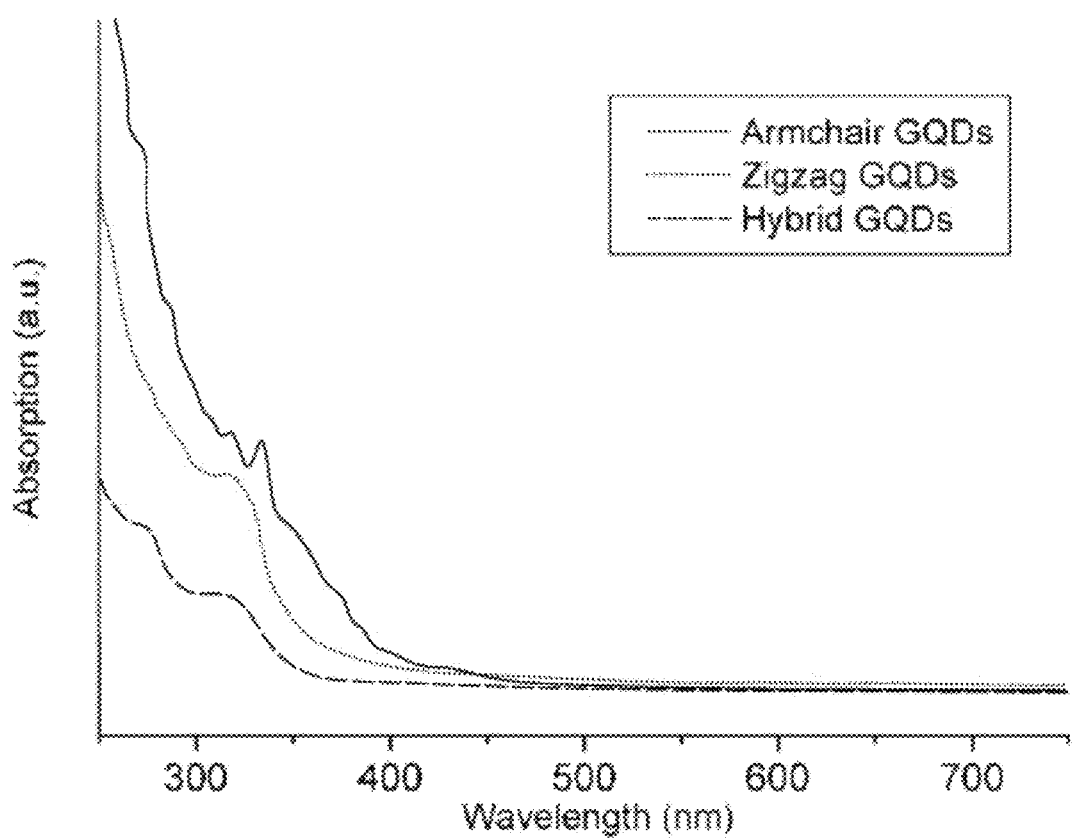
FIG. 29 is UV-vis absorption spectra of armchair, zigzag and hybrid GQD suspensions in ethanol in accordance with an example of the present application disclosure: the intensity difference is due to the concentration difference if three suspensions.

The PL and PLE spectra of the three types of GQDs with the luminescence images of GQD suspensions obtained under 365 nm UV light are shown in FIG. 27A to FIG. 27C and FIG. 28A to FIG. 28C respectively. The UV-Vis absorption spectra of armchair, zigzag, and hybrid GQD suspensions in ethanol are shown in FIG. 29. In general, the shapes of PL spectra of the hybrid (or amphoteric) GQDs appear to be the combination of the spectra of armchair (or nonpolar) and zigzag (or polar) hexagonal GQDs. A similar behavior is also observed in the PLE spectra. In the hybrid GQDs, the carbyne and carbene edges are not directly in contact except at the four corners. It is known that the zigzag and armchair edges of graphene show different electronic and optical properties. Therefore, one could assume that the carbyne and carbene edges of the hybrid GQDs do not strongly affect each other. If this assumption is true, the frequency of the peaks of hybrid GQDs should match to either that of zigzag or armchair GQDs and the intensity may simply correspond to the sum of the intensity of armchair and zigzag GQDs. However, the relative intensity of some PL and PLE peaks of hybrid GQDs is significantly different from that of zigzag or armchair GQDs. For example, the PL spectrum obtained by excitation with 318 or 325 nm is very strong for zigzag GQDs but medium for hybrid GQDs. For the PL spectrum obtained by excitation with 403 nm light, the response is very strong for armchair GQDs, while weak for hybrid GQDs. For PLE spectrum obtained using 378 nm, the response is very strong for zigzag GQDs, while medium for hybrid GQDs. In the PLE spectrum obtained by monitoring at 460 nm, the peaks at 403 and 425 nm are strong for armchair GQDs, while the peaks are weak for hybrid GQDs.

Figure 30:
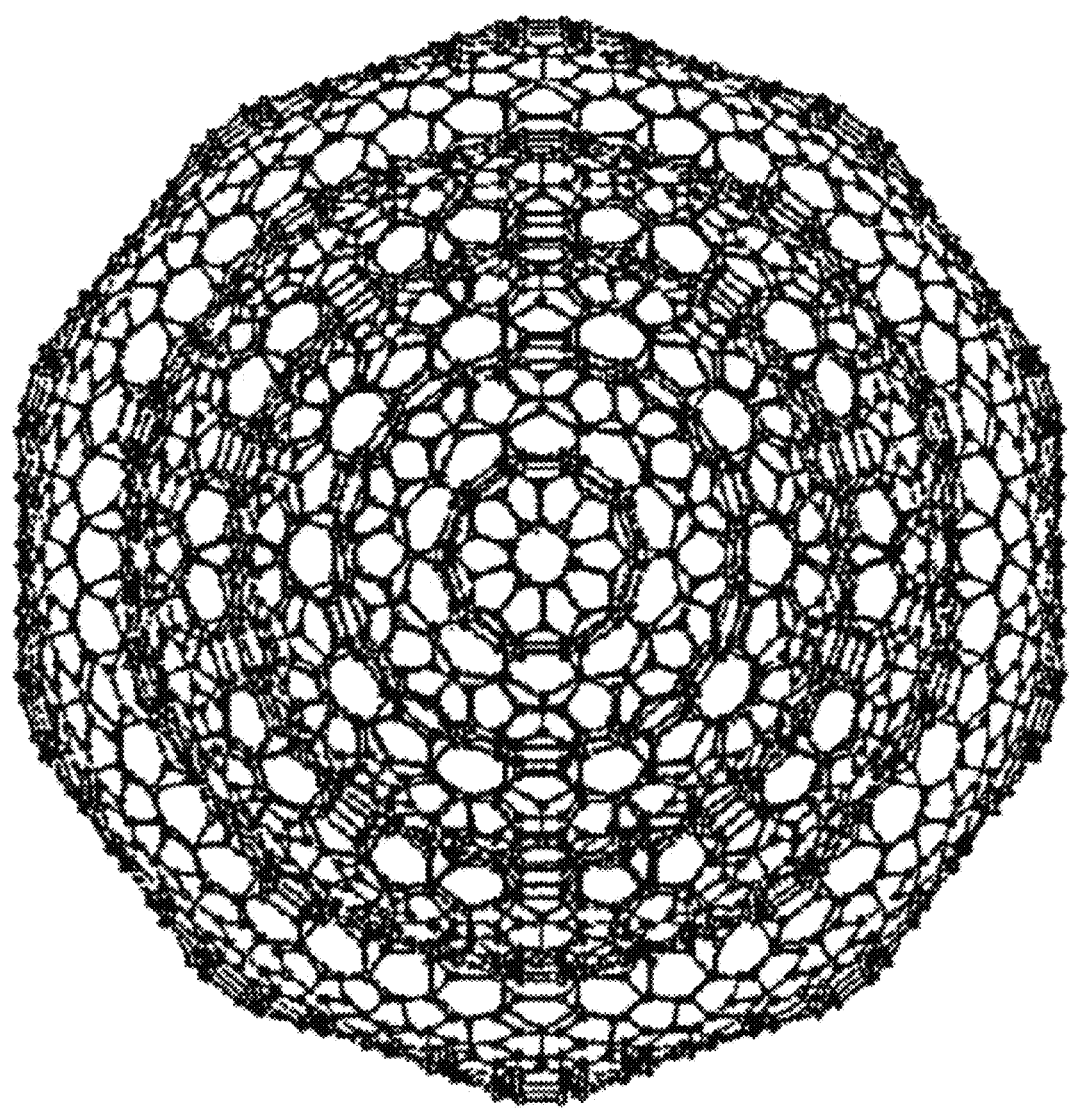
FIG. 30 is a schematic diagram of onion-type carbon material in accordance with an example of the present application disclosure.
Figure 31A:
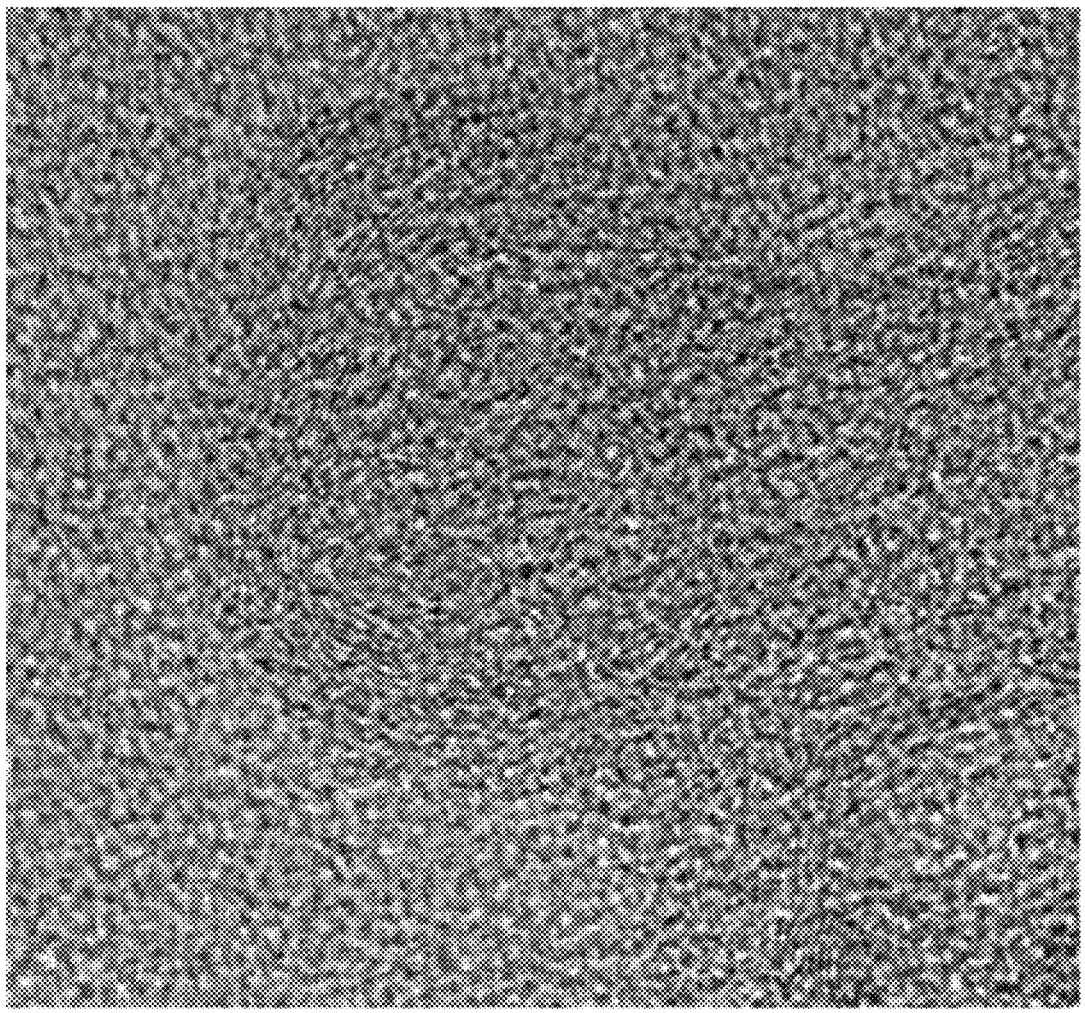
FIG. 31A and FIG. 31B are high resolution TEM image and structure of onion-type carbon and low resolution TEM image of onion-type carbon in accordance with an example of the present application disclosure.
Figure 31B:
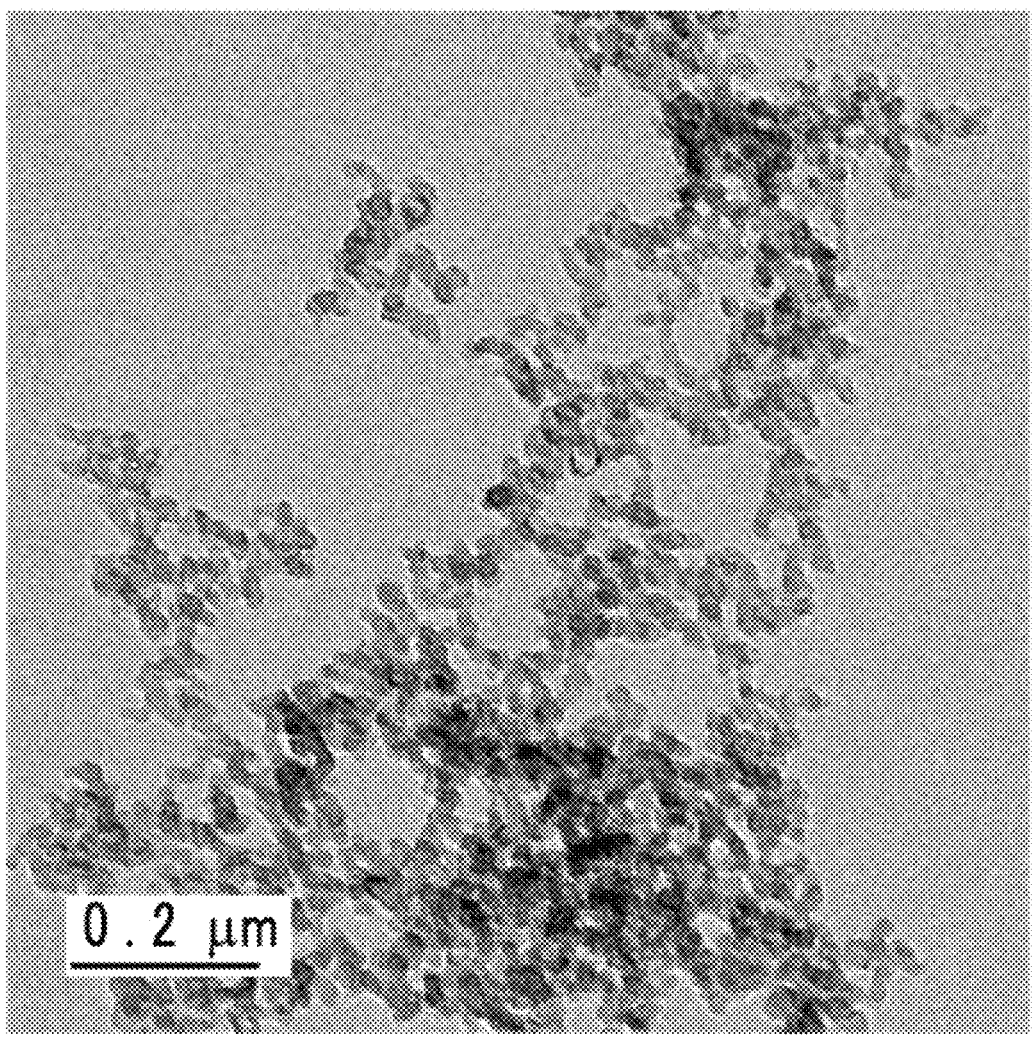
Figure 32:
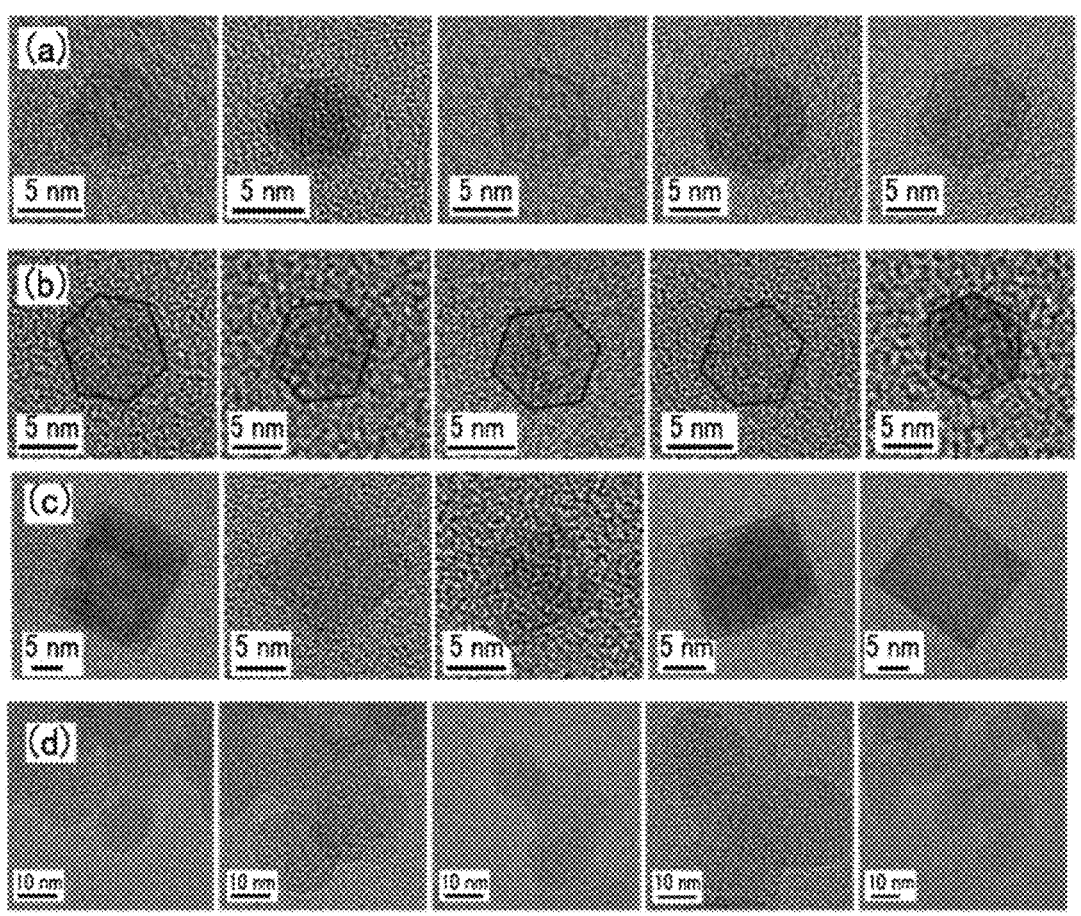
FIG. 32 is TEM images of armchair ((a) of FIG. 32), zigzag ((b) of FIG. 32), hybrid GQDs ((c) of FIG. 32), and onion-type carbon ((d) of FIG. 32) in accordance with an example of the present application disclosure.

As mentioned above, the dominant species in carbon soot is the onion-type carbon material, which does not disperse without sonication. This onion-type carbon material has a nanoparticle form with an average particle size of about 20 nm (in 10 nm to 30 nm range). Further, since the onion-type carbon material does not have a band gap unlike the graphene quantum dots, it does not have photoluminescence and is not dissolved well in a solvent. Furthermore, referring to TEM images (FIG. 30 to FIG. 32), unlike a graphene quantum dots, the onion-type carbon material has a lattice pattern such as onion skins.

The above description of the example embodiments is provided for the purpose of illustration, and it would be understood by those skilled in the art that various changes and modifications may be made without changing technical conception and essential features of the example embodiments. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

The scope of the inventive concept is defined by the following claims and their equivalents rather than by the detailed description of the example embodiments. It shall be understood that all modifications and embodiments conceived from the meaning and scope of the claims and their equivalents are included in the scope of the inventive concept.

110: gas inlet
130: plasma jet
150: carbon source inlet
170: anode
190: cathode
210: power supply
230: tube

We claim:

1. An isolated graphene quantum dot prepared by a process comprising:
   obtaining carbon soot including one or more types of graphene quantum dots by gas phase collision reaction of carbon atoms using a thermal plasma jet;
   adding the carbon soot onto a polar solvent, followed by adding a nonpolar solvent onto the polar solvent, and then leaving the mixture to stand; and
   separating a layer of the polar solvent and a layer of the nonpolar solvent, and then isolating each of graphene quantum dots by removing the solvents from the respective layers,
   wherein the isolated graphene quantum dot comprises one of the following graphene quantum dots:
      a polar graphene quantum dot including a polar surface and a polar edge, the polar graphene quantum dot having a hexagonal shape;
      a nonpolar graphene quantum dot including a nonpolar surface and consisting of nonpolar edges, the nonpolar graphene quantum dot having a hexagonal shape; and
      an amphoteric graphene quantum dot including an amphoteric surface and edges including an amphoteric edge, the amphoteric graphene quantum dot having a rectangular shape,
   wherein each nonpolar edge of the nonpolar graphene quantum dot consists of one or more armchairs of a carbon-carbon triple bond.

2. The isolated graphene quantum dot of claim 1, wherein the surfaces or edges of the graphene quantum dots do not contain oxygen.

* * * * *